(12) United States Patent
Flaim et al.

(10) Patent No.: US 12,360,455 B2
(45) Date of Patent: Jul. 15, 2025

(54) POLY(CYANOCINNAMATE)S FOR STRUCTURAL AND OPTICAL APPLICATIONS

(71) Applicant: Brewer Science, Inc., Rolla, MO (US)

(72) Inventors: Tony D. Flaim, St. James, MO (US); Gu Xu, Rolla, MO (US); Jennifer S. See, St. James, MO (US)

(73) Assignee: Brewer Science, Inc., Rolla, MO (US)

( * ) Notice: Subject to any disclaimer, the term of this patent is extended or adjusted under 35 U.S.C. 154(b) by 1114 days.

(21) Appl. No.: 16/785,163

(22) Filed: Feb. 7, 2020

(65) Prior Publication Data

US 2020/0257202 A1    Aug. 13, 2020

Related U.S. Application Data

(60) Provisional application No. 62/802,742, filed on Feb. 8, 2019.

(51) Int. Cl.
*G03F 7/20* (2006.01)
*C08F 222/32* (2006.01)
*C08G 16/02* (2006.01)
*G03F 7/16* (2006.01)

(52) U.S. Cl.
CPC .......... *G03F 7/202* (2013.01); *C08F 222/32* (2013.01); *C08G 16/0231* (2013.01); *G03F 7/161* (2013.01)

(58) Field of Classification Search
CPC ........ G03F 7/202; G03F 7/161; C08F 222/32; C08G 16/0231
See application file for complete search history.

(56) References Cited

U.S. PATENT DOCUMENTS

| 5,247,055 A | 9/1993 | Stenger-Smith et al. |
| 5,376,650 A * | 12/1994 | Weaver .................. C08G 16/02 525/154 |
| 10,304,720 B2 | 5/2019 | Matos-Perez et al. |
| 2013/0153885 A1 | 6/2013 | Mueller et al. |
| 2016/0077434 A1 * | 3/2016 | Sasahara ................. G03F 7/161 430/273.1 |

(Continued)

FOREIGN PATENT DOCUMENTS

WO    92/22594    12/1992

OTHER PUBLICATIONS

Namazi et al., "Polycondensation of Bis(cyanoacetate) and a, 10bDihydrobenzofuro[2,3-b]benzofuran-2,9-dicarbaldehyde via Knoevenagel Reaction: Synthesis of Donor-Acceptor Polymers Containing Shoulder-to-Shoulder Main Chains," Journal of Appl. Polymer Science, 81(2):505-511, Jul. 2001, 7 pages.

(Continued)

*Primary Examiner* — Mark F. Huff
*Assistant Examiner* — Jayson D Cosgrove
(74) *Attorney, Agent, or Firm* — HOVEY WILLIAMS LLP

(57) ABSTRACT

Methods of preparing poly(cyanocinnamate)s are provided, with those involving mild conditions and resulting in a soluble polymer that is stable at room temperature and can be coated onto microelectronic substrates. The polymer includes at least one bis(cyanoacetate) monomer and at least one aromatic dialdehyde monomer. The polymer exhibits good thermal and structural properties and high absorbance in the UV range.

28 Claims, 4 Drawing Sheets

(56) References Cited

U.S. PATENT DOCUMENTS

2017/0283632 A1* 10/2017 Chiba .................. C09D 133/06
2018/0019156 A1* 1/2018 Matos-Perez ......... B41C 1/1033

OTHER PUBLICATIONS

Wright et al., "Organic NLO Polymers. Linear and Accordion Main-Chain NLO Polymers Prepared by a Knoevenagel Polycondensation," Office of Naval Research, Grant: N00014-91-J-1625, R&T Code: 4132051-01, Technical Report No. 5, Polym. Preprints, 33(1), 1992, pp. 0000, 5 pages.

Wright et al. "Organic Main-Chain NLO Polymers. 1. Copolymerization of Bis(arylcarboxaldehyde) and Bis(cyanoacetate) Monomers Via the Knoevenagel Condensation," Office of Naval Research, Grant: N00014-91-J-1625, R&T Code: 4132051-01, Technical Report No. 9, Macromolecules, May 10, 1992, 25 pages.

Wright et al., "Organometallic NLO Polymers. 3. Copolymerization of Bridged Bis(ferrocenyl) and Bis(cyanoacetate) Monomers Via the Knoevenagel Condensation," Office of Naval Research, Grant: N00014-91-J-1625, R&T Code: 4132051-01, Technical Report No. 8, Macromolecules, May 10, 1992, 23 pages.

Flaim et al., "Structural plastics for flexible hybrid electronics fabrication," Chip Scale Review, vol. 23, No. 3, May/Jun. 2019, pp. 11-14, 5 pages.

Flaim et al., "Novel, Fast-Etching Plastic Packaging Materials for Laser Processing of Flexible Circuits and Printed Electronics," Flex Presentation, Brewer Science, Feb. 20, 2019, 16 pages.

International Search Report and Written Opinion mailed Jun. 17, 2020 in corresponding PCT/US2020/017300, 10 pages.

Wright et al., "Organic Main-Chain Nonlinear Optical Polymers. 1. Copolymerization of Bis(arenecarboxaldehydes) and Bis(cyanoacetate) Monomers via the Knoevenagel Condensation," Macromolecules, vol. 25, No. 22, 1992, 6045-6049, 5 pages.

* cited by examiner

POLY(CYANOCINNAMATE)S FOR STRUCTURAL AND OPTICAL APPLICATIONS

RELATED APPLICATIONS

The present application claims the priority benefit of U.S. Provisional Patent Application Ser. No. 62/802,742, filed Feb. 8, 2019, entitled POLY(CYANOCINNAMATE)S FOR STRUCTURAL AND OPTICAL APPLICATIONS, incorporated by reference in its entirety herein.

BACKGROUND OF THE INVENTION

Field of the Invention

This invention pertains to materials useful for optical and structural applications.

DESCRIPTION OF THE PRIOR ART

Materials for use in CASE (coatings-adhesives-sealants-elastomers) applications both within and outside the microelectronics industry are needed to advance various areas of technology. For instance, materials that can be easily laser-drilled or laser-etched are preferred for patterning of large-area electronic substrates such as printed circuit boards and will undoubtedly find extensive use in the production of flexible circuits and printed electronics. However, many of the plastic materials now being employed in these processes do not etch efficiently under laser exposure and/or leave behind residues that are difficult to remove. Some of these same materials also require high processing temperatures (>250° C.) that are incompatible with the device or the balance of the package. Additionally, most commercial polymer materials are designed for high optical clarity and, therefore, exhibit little or no absorption in the mid-ultraviolet (mid-UV) portion of the spectrum (300-380 nm) where pulsed laser drilling systems operate.

As a class of polymers, poly(cyanocinnamate)s show some promise for these types of applications. However, while poly(cyanocinnamate)s are known from the literature, references to these structures are exceedingly sparse and mainly describe polymer products that are semi-crystalline and, therefore, have limited solubility in organic solvents. Generally, preparation conditions exist that cannot be practiced commercially for reasons of cost and complexity.

SUMMARY OF THE INVENTION

In one embodiment, the invention is directed towards a method of patterning a laserable layer supported on a substrate, or on at least one optionally present intervening layer between the laserable layer and the substrate. The laserable layer comprises a poly(cyanocinnamate), and the method comprises one or both of: exposing the laserable layer to laser energy so as to remove at least a portion of the laserable layer; or contacting a mold having a pattern formed therein with said laserable layer so as to transfer said pattern to said laserable layer.

In another embodiment, the invention provides a structure comprising a microelectronic substrate and a laserable layer on the substrate, or on at least one optionally present intervening layer between the laserable layer and the substrate. The microelectronic substrate is selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, and glass substrates. The laserable layer comprises a poly(cyanocinnamate) and has an upper surface and a lower surface, with the upper surface being remote from the microelectronic substrate, and the lower surface being adjacent the microelectronic substrate. The laserable layer comprises at least one opening formed therein, with the at least one opening having an upper edge at the upper surface, and there being laser ablation residue from the poly(cyanocinnamate) at, near, or both at and near the upper edge of the at least one opening.

In yet a further embodiment, a polymer is disclosed, with the polymer comprising

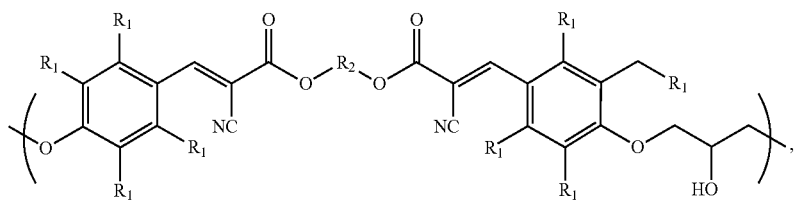

(III)

wherein:
each $R_1$ is individually chosen from hydrogen, alkyls, aryls, aryl ethers, alkylaryls, alkoxys, and halogens; and
$R_2$ is a divalent group.

DETAILED DESCRIPTION OF THE PREFERRED EMBODIMENTS

Figure 1:
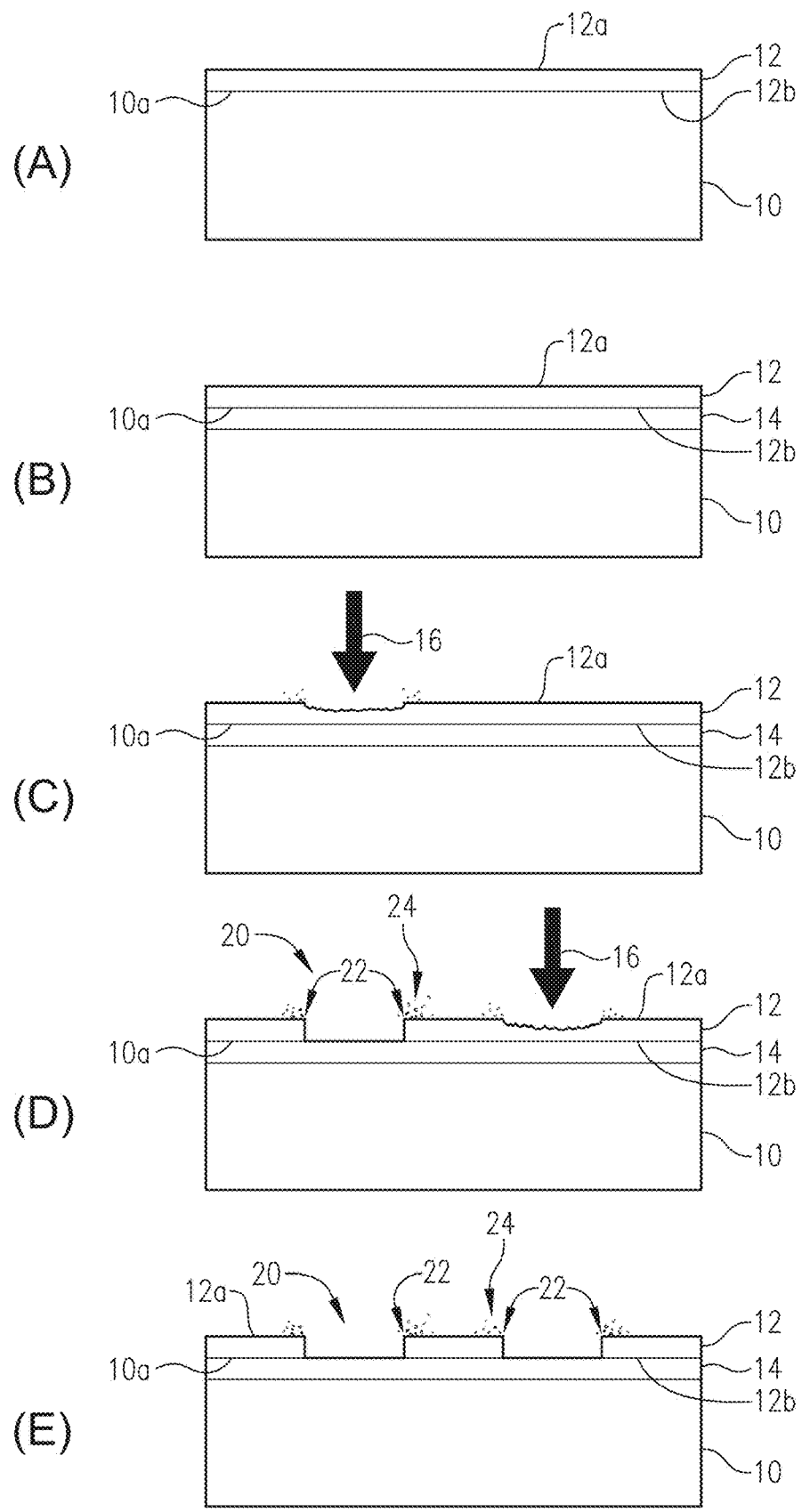
FIG. 1 is a schematic drawing depicting a structure (not to scale) formed by the inventive compositions and process.
Figure 2:
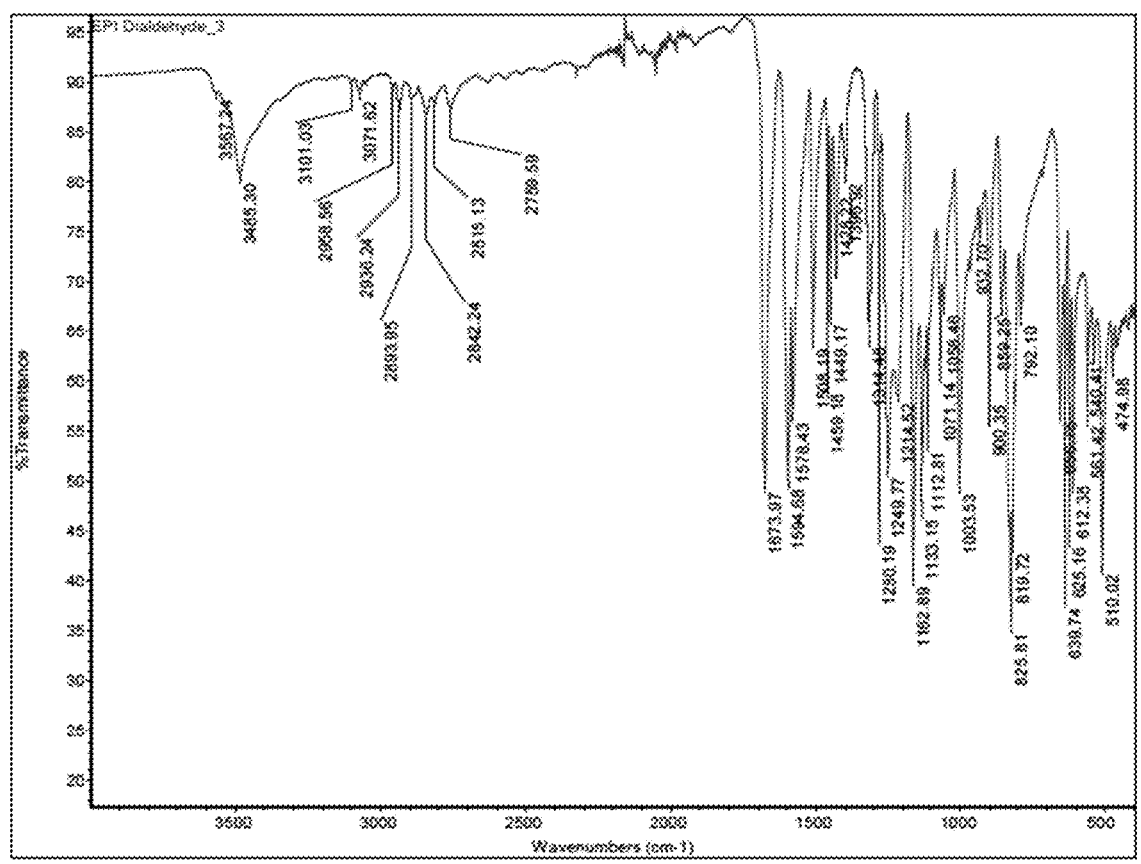
FIG. 2 is an infrared spectrum of the 4EPIDA prepared in Example 1.

The present invention is broadly concerned with poly(cyanocinnamate)s, compositions including those polymers, and methods for their manufacture. These polymers and compositions are suited for use in microelectronic structures, optical applications, and structural applications.

Inventive Polymers

The inventive polymer is a poly(cyanocinnamate), with one preferred poly(cyanocinnamate) comprising the structure (I):

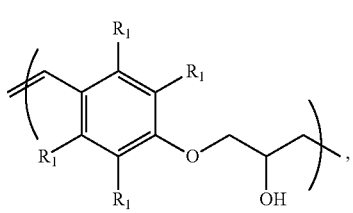

wherein each $R_1$ is individually chosen from hydrogen, alkyls, aryls, aryl ethers, alkylaryls, alkoxys (preferably $C_1$-$C_6$, more preferably $C_1$-$C_4$), and halogens (e.g., fluorine, chlorine, bromine). In the foregoing $R_1$ description, "alkyl" preferably comprises $C_1$-$C_6$ groups, more preferably $C_1$-$C_4$ groups, and even more preferably $C_1$-$C_2$ groups, while "aryl" preferably comprises $C_6$-$C_{14}$ groups, and more preferably $C_6$-$C_{12}$ groups.

In another embodiment, the preferred poly(cyanocinnamate) comprises structure (II):

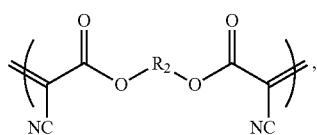

where $R_2$ is a divalent group, and preferably a branched or unbranched divalent radical. Particularly preferred $R_2$ groups are chosen from functionalized (e.g., functionalized with an —OH group) and nonfunctionalized divalent alkyls, divalent cycloalkyls, divalent arylalkyls, and esters. In the foregoing $R_2$ description, "alkyl" preferably comprises $C_1$-$C_6$ groups, more preferably $C_1$-$C_4$ groups, and even more preferably $C_1$-$C_2$ groups, while "arylalkyl" preferably comprises ortho, meta, or para-linked xylene ring, and more preferably a 1,4-xylylene moiety. Particularly preferred $R_2$ groups include divalent ethyl, propyl, methyl propyl, cyclohexyl, and/or xylylene moieties.

Another preferred divalent radical $R_2$ has a branched structure and can be derived by reacting a divalent diol with two moles of cyanoacetic acid. The starting divalent diols are particularly those chosen from divalent forms of propylene glycol; 1,2-butanediol; 2-methyl-1,3-propanediol; 2-butyl-2-ethyl-1,3-propanediol; cyclohexanedimethanol; 2-ethyl-1,3-hexanediol; 2,2,4-trimethyl-1,3-pentanediol; 2,4-diethyl-1,5-pentanediol; 3-hydroxy-2,2-dimethylpropyl 3-hydroxy-2,2-dimethylpropanoate; 3-methyl-1,5-pentanediol; and/or polytetramethylene glycol.

In a particularly preferred embodiment, the poly(cyanocinnamate) comprises both structure (I) and structure (II).

In another embodiment, the poly(cyanocinnamate) is preferably a copolymer of two or more monomers, with preferred such monomers including at least one bis(cyanoacetate) monomer and at least one aromatic dialdehyde monomer. A preferred bis(cyanoacetate) monomer for forming the inventive poly(cyanocinnamate) has the structure:

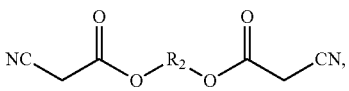

where $R_2$ is as defined previously. In instances where $R_2$ is derived from a diol, branched and/or asymmetrical diol structures are preferred to facilitate greater polymer solubility. However, depending on the final application and polymer properties desired, linear, symmetrical diols such as ethylene glycol, diethylene glycol, 1,3-propanediol, and/or 1,4-butanediol can be utilized to prepare bis(cyanoacetate) monomers that will yield poly(cyanocinnamate) products when reacted with the dialdehyde monomers (discussed below).

One especially preferred bis(cyanoacetate) monomer is polytetramethylene glycol, a difunctional, hydroxy-terminated polyol that is produced commercially in molecular weights ranging from about 250 to about 3,000 g/mol. Other difunctional, hydroxy-terminated polyols such as poly(ethylene glycol), poly(propylene glycol), and/or various polyester polyols, polycarbonate diols, polycaprolactone diols, etc., can be used to prepare similar bis(cyanoacetate) monomers. Likewise, the bis(cyanoacetate) monomer products derived from different diols can be used in admixture to prepare poly(cyanocinnamate)s with unique physical and chemical properties.

Preferred aromatic dialdehyde monomers comprises the following structure:

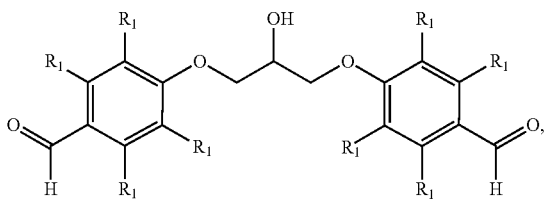

where $R_1$ has the definition given above. Up to about 25 mole % of common aromatic dialdehydes such as terephthalaldehyde can be used in combination with the hydroxypropyl-linked dialdehydes to prepare solvent-soluble poly(cyanocinnamate)s.

Regardless of the chosen starting bis(cyanoacetate) and aromatic dialdehyde monomers, polymer formation occurs via a Knoevenagel-type condensation reaction of the cyanoacetate and aldehyde moieties. The reaction is conducted at or near room temperature in an organic solvent or organic solvent mixture in the presence of a catalyst. The molar ratio of the bis(cyanoacetate) monomers and the aromatic dialdehyde monomers is normally selected to have a value close to unity in order to achieve high polymer molecular weight.

Suitable polymerization solvents include, but are not limited to, dimethyl sulfoxide ("DMSO"), tetrahydrofuran ("THF"), methyl 3-methoxypropionate ("MMP"), tetrahydrofurfuryl alcohol ("THFA"), cyclic and non-cyclic ether solvents such as 1,4-dioxane and diglyme, respectively, and mixtures thereof. The solvent should be present in the reaction solution at from about 60% to about 90% by weight, preferably from about 70% to about 80% by weight, based upon the total weight of the reaction solution taken as 100% by weight. After preparation, the polymer solutions can be diluted with a variety of co-solvents to control their wetting and coating properties. Ketone solvents such as cyclopentanone, cyclohexanone, and methyl ethyl ketone are very useful in this regard since in most cases they will not cause precipitation of the polymer products even when the co-solvent is present in equal or greater concentration than the polymerization solvent.

Suitable catalysts are bases such as a secondary or tertiary amines. Suitable catalysts include, but are not limited to, dibutylamine, triethylamine, piperidine, and/or N,N-dimethyl-4-aminopyridine. The catalyst is present in the polymerization mixture at levels of from about 1 mole % to about 10 mole % based on the molar quantity of the dialdehyde, and preferably about 5 mole % based on the molar quantity of the dialdehyde. In one embodiment, the acetate salt of the amine base can be used as the catalyst.

The molar ratio of the bis(cyanoacetate) monomer to the dialdehyde monomer is preferably from about 0.99 to about 1.01, and more preferably from about 0.995 to about 1.005. The reaction is carried out at a temperature of from about 20° C. to about 35° C., and preferably from about 25° C. to about 30° C. for a time of from about 12 hours to about 60 hours, and preferably from about 24 hours to about 48 hours. Water (about 1-2%) does not have to be removed from the reaction mixture in order to allow the reaction to move to completion, but it may be removed to increase efficiency. Additional solvent may be added to the reaction mixture after polymerization to maintain a manageable viscosity of the solution.

No further polymer isolation is required after preparation; the products can be left in solution and used safely as obtained. The amine catalysts used for polymerization can be removed easily by ion exchange or can be neutralized by the addition of acids such as trifluoroacetic acid to render them inactive and promote long shelf life of the poly (cyanocinnamate) solutions.

Regardless of how the polymer is prepared, a preferred poly(cyanocinnamate) comprises the generic structure (III):

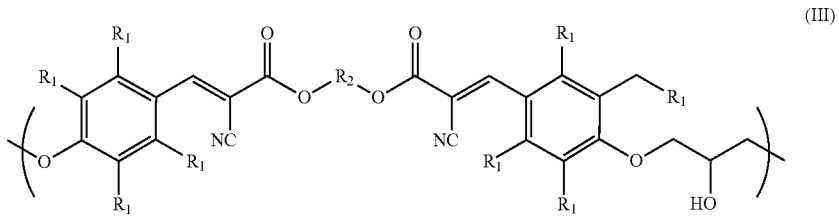

wherein each of $R_1$ and $R_2$ is as defined previously.

Particularly preferred poly(cyanocinnamate)s include the following:

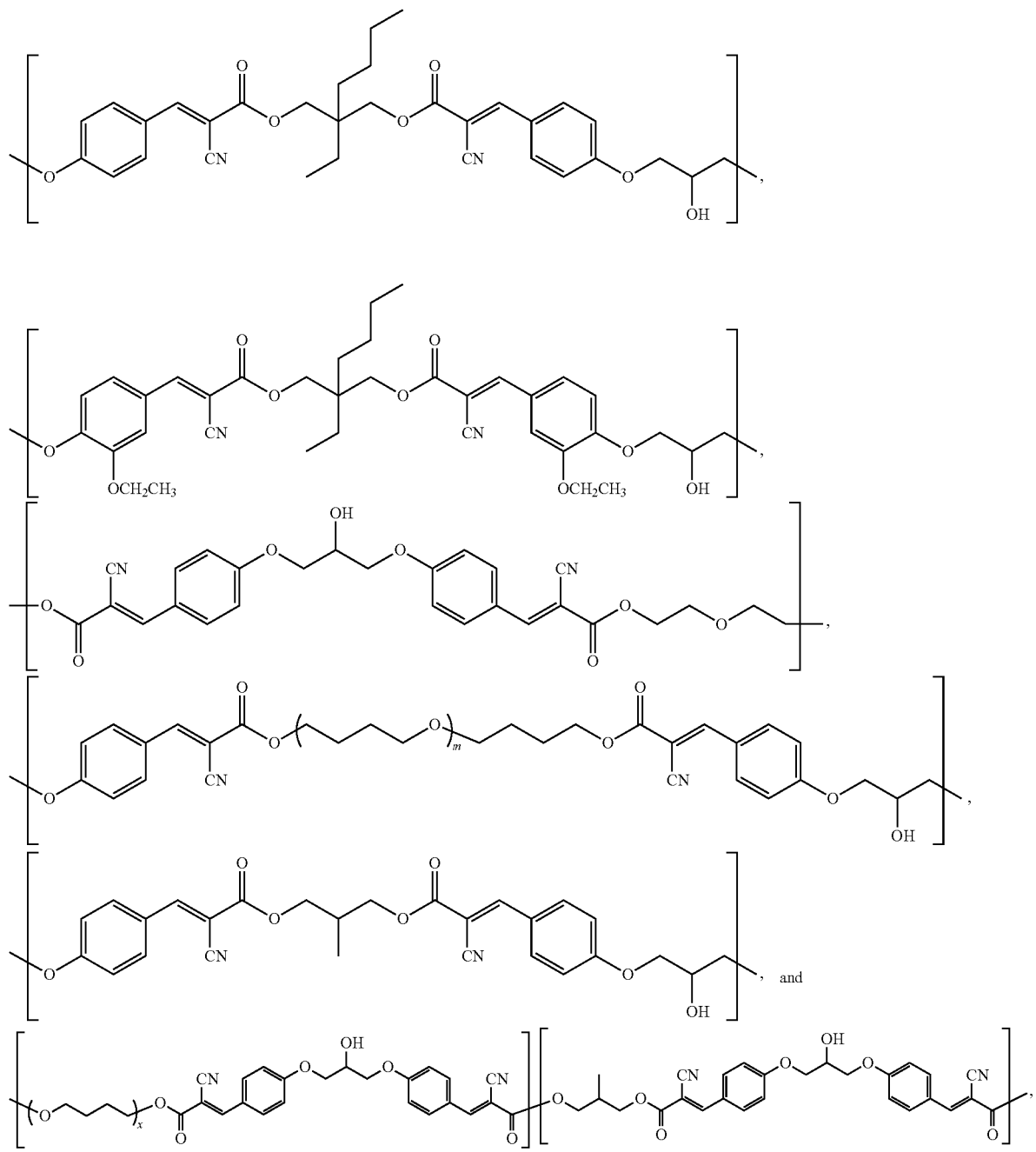

where:
x is 1 to about 50, preferably about 2 to about 50, and more preferably about 2 to about 30; and
m is 1 to about 50, preferably about 2 to about 50, and more preferably about 2 to about 30.

Inventive Compositions

The inventive compositions are formed by mixing the polymer and any optional ingredients with a solvent system. The resulting composition is stable at room temperature and can be coated easily onto microelectronic substrates.

Suitable solvent systems include, but are not limited to, DMSO, THF, MMP, THFA, cyclic and non-cyclic ketones such as cyclopentanone, cyclohexanone, and methyl ethyl ketone, cyclic and non-cyclic ether solvents such as 1,4-dioxane and diglyme, and mixtures thereof. The solvent system is present in the composition from about 60% by weight to about 95% by weight, and preferably from about 70% to about 80% by weight, based upon the total weight of the composition taken as 100% by weight. It will be appreciated that the amount of solvent or solvents added to the material may be adjusted, depending on the deposition method utilized.

The polymer is present in the composition from about 5% by weight to about 40% by weight, and preferably from about 15% to about 30% by weight, based upon the total weight of the composition taken as 100% by weight.

Optionally, other additives may be added to the composition, including, but not limited to, crosslinking agents, surfactants, wetting agents, adhesion promoters, colorants and pigments, and/or other polymers and resins. These additives can be selected depending on the desired properties and use of the final composition, provided they are soluble in the solvent system and compatible with the poly(cyanocinnamate) in solution.

Suitable crosslinking agents for use in the compositions include melamine-formaldehyde, urea-formaldehyde, and/or isocyanate-containing compounds. One especially preferred crosslinking agent is Cymel® 303 LF methoxylated melamine-formaldehyde resin. When utilized, the crosslinking agent is present in the composition from about 5% by weight to about 30% by weight, and preferably from about 10% to about 20% by weight, based upon the total weight of the composition taken as 100% by weight.

Properties of Materials

The final compositions can be formed into films (as described below) that exhibit strong absorbance at wavelengths of from about 200 nm to 400 nm, more preferably from about 300 nm to about 380 nm. In that range of wavelengths, the formed films exhibit optical extinction coefficients, denoted as k values, of preferably at least about 0.05, more preferably at least about 0.1, and even more preferably from about 0.1 to about 0.4.

Additionally, because the materials have the property of crosslinking in response to UV irradiation, this allows the materials to be molded, cast into form, etc., by thermoplastic processing and then hardened by UV exposure. Alternately, areas within the film can be selectively hardened by patterned exposure, for example, to create regions that are stiffer or more thermally stable than other regions.

METHODS OF USING FORMULATIONS

The inventive composition can be applied by any known application method, including dip coating, roller coating, slot coating, die coating, screen printing, draw-down coating, or spray coating. These techniques may require the adjustment of the polymer solids level in the solution to obtain the desired coating thickness and uniformity without defects, for example, by diluting the solution with the principal solvent and/or adding co-solvents as long as they do not cause polymer precipitation. Alternatively, because of their thermoplastic nature, the poly(cyanocinnamate) materials could also be cast into film laminates, molded, embossed, or otherwise formed into free-standing structures. One preferred method involves spin-coating the composition at speeds of from about 500 rpm to about 2,000 rpm, preferably from about 1,000 rpm to about 1,500 rpm, for a time period of from about 20 seconds to about 90 seconds, preferably from about 30 seconds to about 60 seconds.

After the composition is applied, it is preferably heated to a temperature of from about 75° C. to about 150° C., and more preferably from about 100° C. to about 130° C. and for time periods of from about 2 minutes to about 60 minutes, preferably from about 10 minutes to about 30 minutes to remove any remaining solvent. Also, in some instances, the above application and bake process can be repeated on a further aliquot of the composition, so that the layer is "built" on the substrate in multiple steps.

Depending on the desired application, the film can then be cured by application of heat or UV radiation. When heat is used to cure film, it is preferably baked at a temperature from about 175° C. to about 225° C., more preferably from about 180° C. to about 200° C. for a time period preferably from about 5 minutes to about 60 minutes, more preferably from about 15 minutes to about 30 minutes. When UV radiation is used to cure the film, it is preferably exposed using a wavelength from about 200 nm to about 400 nm, more preferably using a commercially available UV lamp system with strong emission at wavelengths in the range of 250-380 nm for a time period of preferably from about 10 seconds to about 10 minutes, more preferably from about 30 seconds to about 5 minutes. Curing the film produces improved solvent resistance, greater toughness, and higher resistance to thermally induced softening. The curing reactions do not require the addition of any catalysts or separate curing agents. However, curing agents will react effectively with the poly(cyanocinnamate) materials via the secondary hydroxyl group of the dialdehyde when the system is catalyzed appropriately.

The foregoing describes the methods of forming the inventive layer where those forming methods are independent of the subsequent processing conditions. The layer could be applied and require little to no subsequent processing, such as if it were being used for structural plastics or as a protective coating. In other instances, the layer can be subjected to one or more processing steps (e.g., laser patterning, embossing).

1. Laser Patterning

FIGS. 1(A)-1(D) schematically illustrate the inventive method of forming a structure applying the inventive formulations and subsequently using the formed layer in a laser patterning process. In this method, a substrate 10 having a surface 10a is provided. Any microelectronic substrate can be used in the invention. Preferred substrates are semiconductor substrates, such as those selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, and combinations of the foregoing.

The method comprises applying a quantity of the inventive composition to the substrate 10 to form a layer 12 (which is preferably an insulating dielectric layer) of the composition on the surface 10a of the substrate 10 (FIG. 1(A)). The application method can be as described above or, in a preferred application method the composition is spin-coated at speeds of from about 500 rpm to about 5,000 rpm (preferably from about 1,000 rpm to about 2,000 rpm, and more preferably from about 1,000 rpm to about 1,500 rpm) for a time period of from about 20 seconds to about 90 seconds (preferably from about 30 seconds to about 60 seconds). The substrate 10 can have a planar surface, or it can include topography features (via holes, trenches, contact holes, raised features, lines, etc.). As used herein, "topography" refers to the height or depth of a structure in or on a substrate surface. For example, the substrate 10 can comprise structure defining a hole, which includes sidewalls and a bottom wall. Thus, the method of applying the inventive composition to the substrate 10 would preferably include applying the composition to at least a portion of those hole sidewalls and bottom wall.

After the formulation is deposited, the solvent may be removed by baking at a temperature of from about 50° C. to about 200° C., preferably from about 60° C. to about 145° C., and more preferably from about 75° C. to about 125° C. The baking time used to remove the solvent may be from about 5 minutes to about 30 minutes, depending on the amount of solvent used and the baking temperature. In some embodiments, a baking step (the above baking step and/or a different baking step) can be performed to crosslink the composition in cases where a crosslinking agent is used, thus forming crosslinked cyanocinnamate groups in the layer 12. If the substrate surface 10a includes topography, the coating 12 is preferably applied at a thickness sufficient to substantially cover the substrate topography at these thicknesses.

The layer 12 has a number of desirable properties. For example, in one embodiment, coating or layer 12 can be used as a dielectric layer. In this embodiment, the dielectric constant of layer 12 is preferably less than about 4, more preferably from about 2 to about 4, and even more preferably from about 2.5 to about 3.5.

As noted in the figures, final coating 12 has an upper surface 12a and a lower surface 12b. Although the foregoing depicts the lower surface 12b of the layer 12 being in direct contact with the substrate surface 10(a), it will be appreciated that any number of optional intermediate layers 14 may be formed on the substrate surface 10(a) prior to processing. These intermediate layers 14 include those selected from the group consisting of adhesion promoting layers, metal layers, and both. These optional layers 14 would be formed according to conventional processes, and then the layer 12 would be formed on top of the last/uppermost intermediate layer 14 that is utilized, following the process described above, so that the lower surface 12b of layer 12 is in contact with the uppermost intermediate layer 14. This embodiment is depicted in FIG. 1(B).

Regardless of whether intermediate layer(s) 14 are included, the layer 12 is then patterned by laser ablation, preferably using an excimer laser to expose the layer 12 to laser energy. A laser beam 16 is applied in short pulses to the material forming layer 12. The laser may be used in a "direct write" fashion in which a small laser beam is rastered only in the areas to be ablated (FIG. 1(C)), or the laser may be applied through a metal mask (not shown) so as to only ablate the areas where the laser is able to pass through the mask. The laser energy is absorbed by the material of layer 12 and as a result of various photochemical and thermal effects, portions of the layer 12 are removed to create a first opening 20 (FIG. 1(C)). The laser can then be directed to other areas of layer 12 where removal is desired and further ablation can be carried out (FIG. 1(D)) to form a further opening(s) 20 (FIG. 1(E)).

The excimer laser wavelength is preferably from about 200 nm to 450 nm, more preferably from about 250 nm to 400 nm, and even more preferably from about 300 nm to 400 nm. The pulse rate is less than about 4,000 Hz, preferably from about 100 Hz to about 3,500 Hz, more preferably from about 1,000 Hz to about 3,000 Hz, and even more preferably from about 2,000 Hz to about 3,000 Hz. The pulse length can be from about 1 µs to about 100 ps, depending on the type of pulsed laser being used. The amount of material removed is dependent upon the material, laser wavelength, pulse rate, and pulse length.

There will typically be some amount of ablation debris residue (i.e., decomposed polymer) 24 that collects at and/or near the upper edge 22 of opening(s) 20 (on upper surface 12a-FIG. 1(E)). Vacuum may be applied during the ablation process to remove the ablated material to minimize or even prevent debris from forming on the surface of the layer 12. Advantageously, these materials can be ablated with minimal or substantially no debris. The amount of debris left post-ablation can be measured using optical microscopy. Ultimately, any remaining debris can be removed with an organic solvent such as cyclopentanone, cyclohexanone, dimethylformamide, dimethylsulfoxide, N,N-dimethylacetamide, gamma butyrolactone, and mixtures thereof.

This selective removal can produce features such as lines of the material of layer 12 with spaces between the lines where the material has been removed, or in vias (holes) in the material of layer 12, and it will be appreciated that any pattern could be formed by the laser ablation. When lines and spaces are formed using the laser ablation, the width of the lines and spaces is preferably less than about 200 microns, more preferably from about 1 micron to about 70 microns, and even more preferably from about 20 microns to about to 60 microns. When vias are formed using the laser ablation, the diameter of the vias that are formed is preferably less than about 700 microns, more preferably from about 1 micron to about 500 microns, and even more preferably from about 10 microns to about 300 microns. Advantageously, the sidewalls of the features may be substantially perpendicular to the surface of the substrate, that is, the sidewalls of the features make an angle of preferably from about 70° to about 110° with the surface 10(a) of the substrate 10 (or of the surface of uppermost of any intermediate layers 14 present), and more preferably an angle of about 90° with the surface of the substrate.

As noted previously, variations of the present invention include the use of an intermediate layer 14 (FIGS. 1(B)-(E)), or the formation of the layer 12 directly on the substrate 10 (FIG. 1(A)). Another variation is that the layer 12 does not have to be ablated/removed across its entire thickness. That is, in FIG. 1(E), the openings 20 are shown to run across the entire thickness of layer 12 (i.e., from upper surface 12a to and through lower surface 12b), thus exposing the intermediate layer 14 under layer 12 (or the substrate 10, in instances where no intermediate layer 14 is included). However, if desired, only part of the thickness of layer 12 could be ablated so that the material forming layer 12 remains at the bottom of the opening 20, even to the degree that none of the underlying layer 14 or substrate 10 are exposed.

2. Embossing

It will also be appreciated that the inventive layers can be patterned with an embossing or imprinting process. In this embodiment, the layer is formed as described previously, but a mold having a surface comprising a negative image of the desired pattern formed therein is then pressed against the softened and/or flowable (but in either case, uncured) composition layer for sufficient time and at sufficient temperatures and pressures to transfer the negative image of the mold to the layer of flowable composition. It may be necessary to heat the composition to its flow temperature prior to and/or during this step. The pressing step will generally comprise applying pressures of from about 1 psi to about 100 psi, more preferably from about 10 psi to about 50 psi, and will be carried out at temperatures of from about 100° C. to about 200° C., more preferably from about 150° C. to about 200° C., for a time of from about 1 minute to about 10 minutes, more preferably from about 2 minutes to about 5 minutes. This process is preferably carried out under vacuum, although ambient conditions may be used. Suitable molds include molds made of a non-stick material, including, but not limited to, polysiloxane, fluoropolymers, and combinations thereof.

While the mold and the substrate are maintained in contact, the inventive composition is hardened or cured by conventional means. For example, if the composition is photo-curable, then it is subjected to light, such as UV light, at a wavelength appropriate for the particular composition, so as to cure the layer. Likewise, if the composition is thermally curable, it can be cured by application of heat (e.g., via a hotplate, oven, IR heating, etc.) followed by cooling to less than its $T_g$. Regardless of hardening or curing means, the mold is ultimately separated from the substrate, yielding a substrate patterned as needed for further processing. Alternatively, for a thermoplastic material, the inventive composition may be heated to above its $T_g$ during the imprinting step as described above, and then the composition can be cooled to below its $T_g$ before the mold and substrate are separated. The patterned layer may then be cured, such as by thermal- or photo-cure processes.

It will be appreciated that the inventive processes possess significant advantages in that a wide range of dimensions can be achieved by these processes. For example, the inventive processes can be used to form substrates having topography and features sizes of less than about 10 microns. At the same time, in applications where larger topography and feature sizes are desirable, topography and feature sizes of greater than about 100 μm, and even as large as up to about 50,000 μm can be obtained.

The inventive poly(cyanocinnamate)s possess high optical density at the mid-UV wavelengths commonly used for pulsed laser drilling and etching. As a result, they exhibit exceptionally fast and clean laser etching. The materials can be processed at less than about 200° C. and have the requisite strength and toughness along with the thermal and chemical stability to serve as microelectronic substrates, dielectrics, adhesives, gap-filling coatings, and/or passivation layers. They can be processed as thermoplastics at temperatures below about 200° C. and then be cured after deposition by UV exposure and/or heating at about 200° C.

The poly(cyanocinnamate)s also possess very high mid-UV absorption in the mid-UV region and, as a result, show high sensitivity to laser exposure. This enables the use of lower laser power settings and fewer exposure cycles to etch a material of a given thickness.

Finally, the poly(cyanocinnamate)s are thermoplastic polymers containing benzylidene-linked functional moieties that give rise to very strong absorption of ultraviolet light. These moieties impart high sensitivity to pulsed laser scanning systems operating in the same wavelength range, leading to efficient ablation and clean removal of exposed material. The polymers are preferably prepared from aromatic dialdehydes in which two formyl-substituted phenoxy rings are connected by a 1,3-bis-2-hydroxypropyl linkage, which confers good solvent solubility on the polymer products.

Additional advantages of the various embodiments of the invention will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth preferred methods in accordance with the invention. It is to be understood, however, that these examples are provided by way of illustration and nothing therein should be taken as a limitation upon the overall scope of the invention.

Example 1

Preparation of 1,3-bis(4-formylphenoxy)-2-hydroxypropane ("4EPIDA")

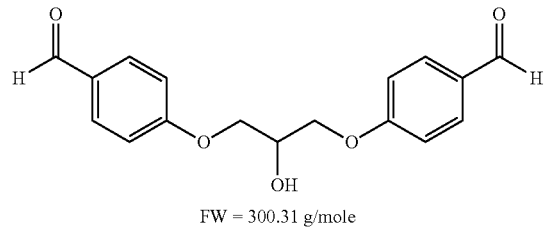 [SMILES: O=Cc1ccc(OCC(O)COc2ccc(C=O)cc2)cc1]

FW = 300.31 g/mole

In this procedure, 320 ml of ethanol (Sigma-Aldrich, St. Louis, MO) were charged into a 1000-ml, three-necked, round-bottom flask fitted with a Teflon®-coated stirring bar, nitrogen inlet, and reflux condenser. The flask was immersed in a silicone oil bath seated on a temperature-controlled hot plate/magnetic stirrer. A low nitrogen purge was initiated in the flask, after which 97.70 grams (0.80 mole) of 4-hydroxybenzaldehyde (98%, Sigma-Aldrich, St. Louis, MO) were dissolved in the ethanol by stirring. Next, 153.14 grams (0.42 mole) of 25% aqueous tetramethylammonium hydroxide (TMAH) solution (Sigma-Aldrich, St. Louis, MO) were added slowly into the solution. Once the solution clarified, 37.01 grams (0.40 mole) of epichlorohydrin (≥99%, Sigma-Aldrich, St. Louis, MO) dissolved in 80 ml of ethanol were added into the mixture. The contents were heated to reflux for 12 hours and subsequently cooled to room temperature, after which the product, 4EPIDA, crystallized from the mixture in 80-85% yield (5 batches). The melting points of the batch-wise products by differential scanning calorimetry (DSC) were in the range of 141°-144° C. The infrared spectrum for the obtained 4EPIDA product is depicted in FIG. 1. Its features are consistent with the assignment of a 2-hydroxypropyl-linked aromatic dialdehyde structure.

Example 2

Preparation of 1,3-bis(4-formyl-2-ethoxyphenoxy)-2-hydroxypropane ("EVANDA")

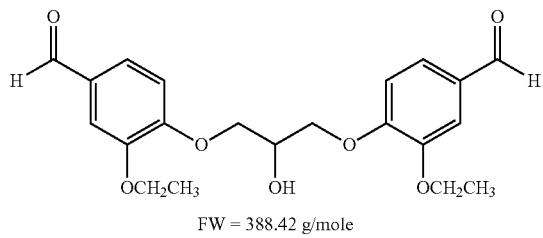 [SMILES: CCOc1cc(C=O)ccc1OCC(O)COc1ccc(C=O)cc1OCC]

FW = 388.42 g/mole

Into a 250-ml, round-bottom flask fitted with a stirring bar, condenser, and nitrogen inlet were added 32.09 grams (193.1 mmol) of ethyl vanillin (Sigma-Aldrich, St. Louis MO), 50.0 grams of ethanol, and then while stirring, 36.96 grams (101.4 mmol) of 25% aqueous TMAH (Alfa Aesar, Ward Hill MA). When these were well combined, 8.93 grams (96.5 mmol) of epichlorohydrin were added to the mixture and washed in with 22.0 grams of ethanol. The mixture was heated to reflux (~85° C.) for 24 hours under nitrogen cover and then cooled to room temperature to allow the product to crystallize. The crystallized material was collected and dried at 50° C. under vacuum to yield about 32 grams (85%) of crude product with a melting point at 102° C.

A portion of the crude product (10 grams) was recrystallized from denatured alcohol (Alfa Aesar, Ward Hill MA) by forming a 15% solution and allowing it to cool without agitation. The product began crystallizing into nodular masses within an hour after being removed from the heat. It was collected, washed with two portions of cold alcohol, and vacuum dried at 50° C. overnight to obtain a 73% yield of pure EVANDA melting at 105°-106° C.

Figure 3:
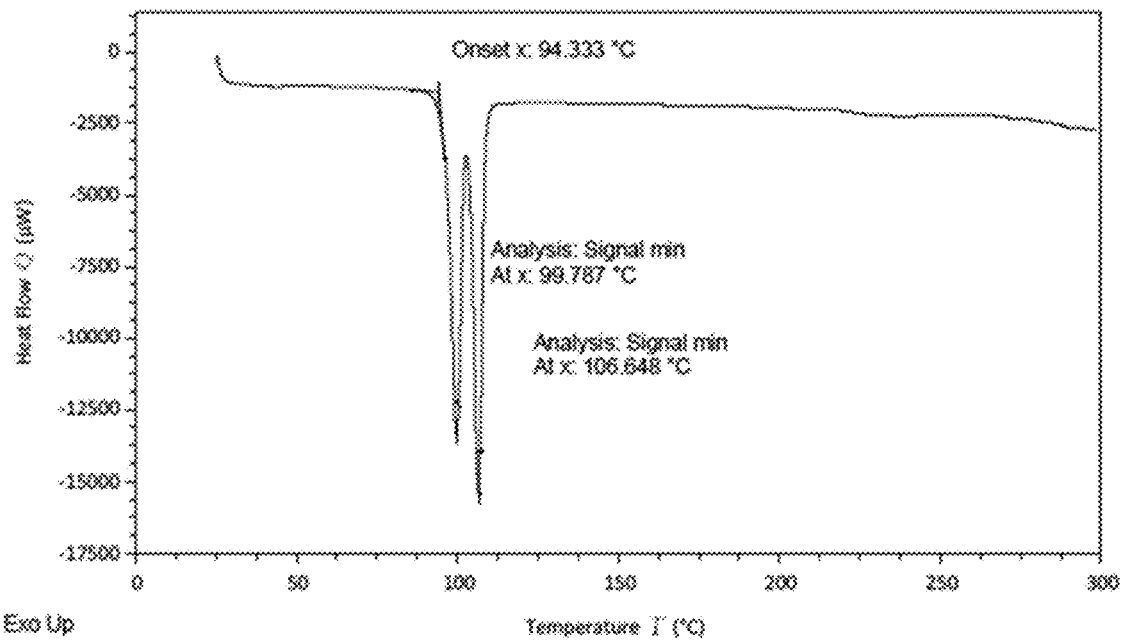
FIG. 3 shows the melting points of EVANDA as measured by differential scanning calorimetry (Example 2)

A series of recrystallization trials showed that pure EVANDA is a polymorphic material that can crystallize into two forms, one form melting at 99°-100° C. and a second form melting at 106°-107° C. Mixtures of the two forms were often obtained when the crude product was recrystallized. This is evident from the double melting peaks in the differential scanning calorimetry ("DSC") scan obtained for recrystallized EVANDA material that is pictured in FIG. 3.

Figure 4:
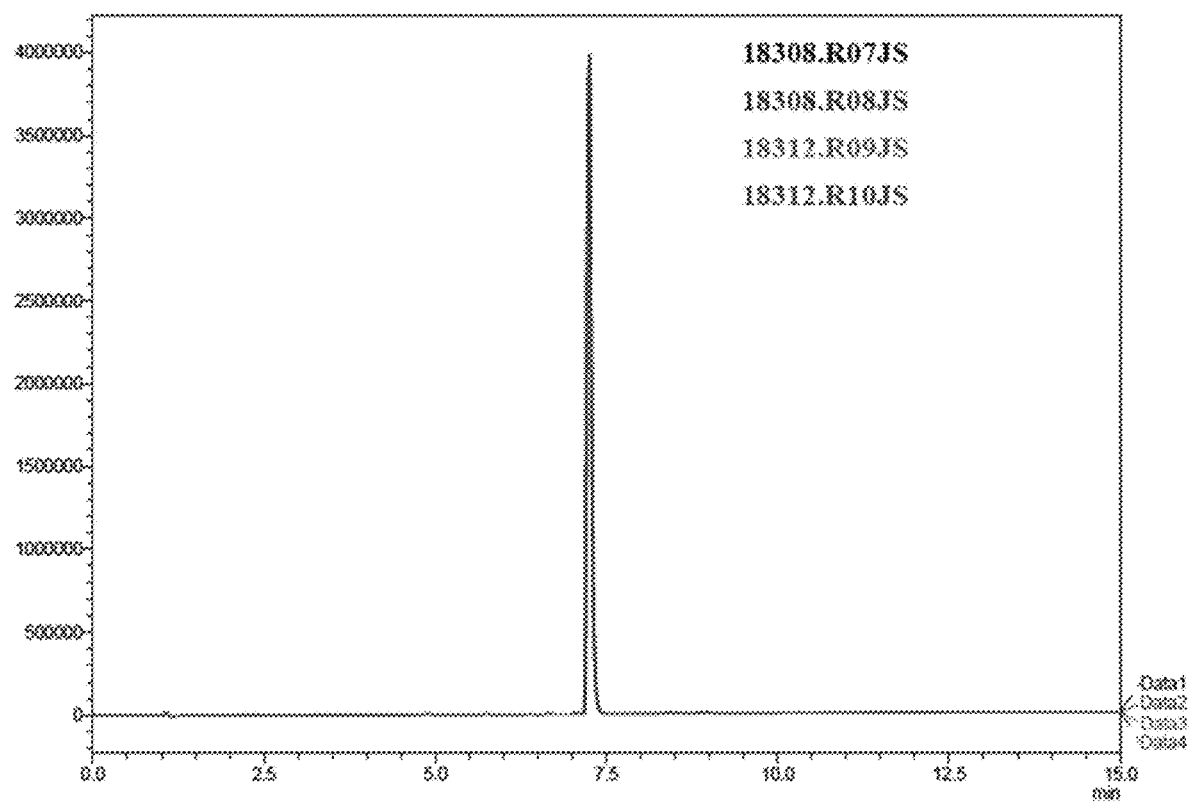
FIG. 4 is a high-performance liquid chromatography of the overlay spectra of four EVANDA samples as described in Example 2.

High-performance liquid chromatography ("HPLC") analyses (see overlay spectra in FIG. 4) of four EVANDA batches recrystallized from the same crude lot and each having different twin melting point features confirmed that only a single compound was present in all the recrystallized product batches. EVANDA purity was >97%.

Example 3

Preparation of Cyanoacetoxyethyl Ether ("CAEE")

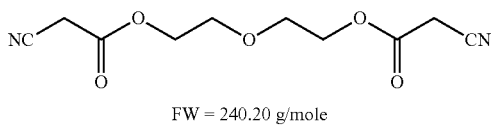 [SMILES: N#CCC(=O)OCCOCCOC(=O)CC#N]

FW = 240.20 g/mole

In a three-necked, 250-ml, round-bottom flask fitted with a temperature-controlled oil bath, nitrogen inlet, magnetic stirrer, and a Dean-Stark trap with condenser were combined 25.00 grams (0.236 mol) of diethylene glycol (Sigma-Aldrich, St. Louis MO), 60.12 grams (0.707 mol) of cyanoacetic acid (Sigma-Aldrich, St. Louis MO), and 3.4 grams of p-toluenesulfonic acid monohydrate (TCI America, Portland OR). The reactants were washed with 100 ml of toluene (Sigma-Aldrich, St. Louis MO). The flask was then closed, and the contents were heated to reflux while stirring under a light nitrogen flow. Water produced by the esterification reaction was removed continuously and deposited in the Dean-Stark trap. The calculated amount of byproduct water (8.5 grams) was removed within a few hours. An oily product phase separated from the bulk of the toluene solution when the contents were cooled to room temperature. The toluene layer was removed, and the product phase was washed with 500 grams of 5% sodium bicarbonate solution (Sigma-Aldrich, St. Louis MO) to extract unreacted cyanoacetic acid and the sulfonic acid catalyst. The sample was then diluted with 50 ml of ethyl acetate (Sigma-Aldrich, St. Louis MO), transferred to a 250-ml, single-necked flask, and rotovaporated at 70° C. under vacuum to remove the volatile components. The CAEE product liquid that remained crystallized over several days into a hard solid, melting at 48° C. The yield of CAEE was 52%.

Example 4

Preparation of 2-butyl-2-ethyl-1,3-bis(cyanoacetoxy)propane ("BEBCAP")

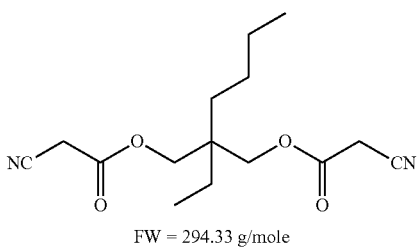 [SMILES: CCCCC(CC)(COC(=O)CC#N)COC(=O)CC#N]

FW = 294.33 g/mole

Into a three-necked, 500-ml, round-bottom flask with a temperature-controlled oil bath, nitrogen inlet, magnetic stirrer, and a Dean-Stark trap with condenser were combined 75.50 grams (0.472 mol) of 2-butyl-2-ethyl-1,3-propanediol (TCI America, Portland OR), 120.24 grams (1.414 mol) of cyanoacetic acid, and 7.8 grams of p-toluenesulfonic acid monohydrate, along with 200 ml of toluene. The flask was closed, and the contents were heated at reflux while stirring under a brisk nitrogen flow. Byproduct water produced by the esterification reaction was removed continuously from the reactor and deposited in the Dean-Stark trap. The calculated amount of water (17.0 grams) to be produced by the reaction was removed within about six hours, after which the contents were cooled to room temperature and formed a slightly hazy toluene solution. The reaction mixture was poured into a 2-liter plastic beaker containing 1200 ml of 5% sodium bicarbonate solution and briskly stirred for 30 minutes to extract unreacted cyanoacetic acid and the sulfonic acid catalyst from the product solution. The entire extraction mixture was then transferred to a large reparatory funnel and the aqueous and product phases were allowed to separate.

The aqueous phase was discarded, and the washed product phase was returned to the original reactor and heated to reflux to remove water via the Dean-Stark trap. Once no more water was collected, the contents were cooled to room temperature and then transferred to a 500-ml round-bottom flask and rotovaporated under vacuum at 70° C. to remove toluene and leave the BEBCAP product. The final yield was 128 grams (92%) of a thick, light brown liquid product.

Example 5

Preparation of 2-methyl,1,3-bis(cyanoacetoxy)propane ("MBCAP")

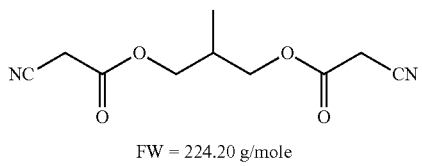 [SMILES: CC(COC(=O)CC#N)COC(=O)CC#N]

FW = 224.20 g/mole

In a three-necked, 500-ml round bottom flask fitted with a temperature-controlled oil bath, nitrogen inlet, magnetic stirrer, and a Dean-Stark trap with condenser were combined 42.54 grams (0.472 mol) of 2-methyl-1,3-propanediol (Sigma-Aldrich, St. Louis MO), 120.24 grams (1.414 mol) of cyanoacetic acid, and 6.5 grams of p-toluenesulfonic acid monohydrate along with 200 ml of toluene. The reactor was closed, and the contents were heated to reflux while stirring under a brisk nitrogen flow. Byproduct water was removed continuously from the contents and deposited in the Dean-Stark trap as the esterification reaction proceeded. The calculated amount of water (17.0 grams) to be produced was removed within five hours. The contents were then cooled to room temperature and diluted with 100 ml of ethyl acetate to prevent separation of the crude product from the toluene solution. The resulting mixture was poured into a 2-1 beaker containing 1200 ml of 5% sodium bicarbonate solution and agitated well for 30 minutes to extract unreacted cyanoacetic acid and the sulfonic acid catalyst from the product liquid. The phases were then allowed to separate, and the aqueous phase was discarded. The organic phase containing the product was transferred to a 500-ml round-bottom flask and rotovaporated under vacuum at 70° C. to remove the toluene and ethyl acetate and leave the product. The latter was obtained as 87 grams (82%) of clear, light yellow liquid.

Example 6

Preparation of alpha-omega-bis(cyanoacetoxy)ester of polytetrahydrofuran ("BCAPolyTHF")

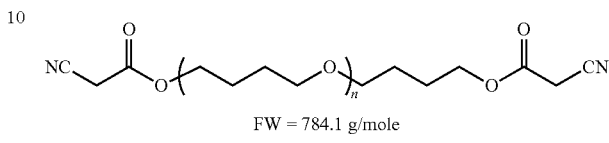

FW = 784.1 g/mole

In a three-necked, 500-ml, round-bottom flask fitted with a temperature-controlled oil bath, nitrogen inlet, magnetic stirrer, and a Dean-Stark trap with condenser were combined 143.6 grams (0.221 mol) of polytetrahydrofuran (number-average molecular weight=650 g/mole, Sigma-Aldrich, St. Louis MO), 56.4 grams (0.663 mol) of cyanoacetic acid, and 8.0 grams of p-toluenesulfonic acid monohydrate, along with 200 ml of toluene. The reactor was closed, and the contents were heated to reflux while stirring under a brisk nitrogen flow. Water from the esterification reaction was removed continuously from the contents and deposited in the Dean-Stark trap. The calculated amount of water to be produced (8+ grams) was removed within four hours. The contents were transferred to a 1-liter beaker and washed with 600 ml of 5% aqueous sodium bicarbonate solution. This mixture was stirred vigorously and then allowed to stand overnight whereupon it separated into a clear aqueous phase and a cloudy organic phase. The entire mixture was poured into a separatory funnel and the aqueous phase was drained off and discarded. The organic, product-containing phase was then returned to the original reaction vessel and heated to reflux to remove water acquired during the washing step. About 7 ml of water were removed. The product phase was then rotovaporated under vacuum at 90° C. to remove toluene and other volatile components and leave the BCA-PolyTHF product, which was obtained as a thick, reddish-brown liquid in 97% yield (168 grams).

Example 7

Polymerization of BEBCAP and 4EPIDA Copolymer in Methyl 3-methoxypropionate ("MMP") Using Dibutylamine as a Catalyst

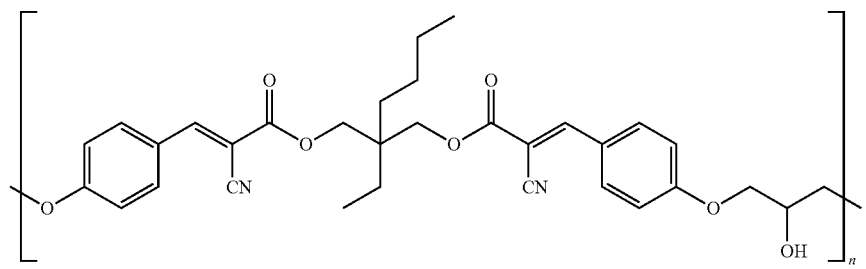

BEBCAP (biscyanoacetate monomer) and 4EPIDA (dialdehyde monomer) were copolymerized at room temperature in methyl 3-methoxypropionate (MMP) solvent in the presence of 6 mol % dibutylamine based on the moles of dialdehyde and at a calculated polymer solids content of 30 wt. %. The reaction was allowed to proceed for 48 hours, after which the catalyst was neutralized by the addition of a stoichiometric amount of trifluoroacetic acid. In a 250-ml round-bottom flask fitted with a magnetic stirring bar were combined 15.807 grams (53.7 mmol) of BEBCAP, 16.128 grams (53.7 mmol) of 4EPIDA, 4.165 grams (3.2 mmol) of 10% dibutylamine (Sigma-Aldrich, St. Louis MO) in propylene glycol methyl ether (PGME), and 60.23 grams of MMP (Sigma-Aldrich, St. Louis MO). The contents were stirred for 48 hours at room temperature, over which time the solution steadily grew more viscous, forming a thick, transparent yellow-brown solution. The solution was then neutralized by adding 3.674 grams (3.2 mmol) of 10% trifluoroacetic acid (Sigma-Aldrich, St. Louis MO) in PGME and stirring until it was homogeneous. Gel permeation chromatography (GPC) analysis of the molecular weight characteristics of the resulting polymer yielded a weight-average molecular weight (Mw) of 90,346 and number-average molecular weight (Mn) of 17,407.

A film was cast from the polymer solution onto a glass slide and dried at 100° C. for 20 minutes. The film was clear and homogenous and showed strong adhesion to the glass when scraped with a razor blade.

Example 8

Polymerization of BEBCAP and 4EPIDA Copolymer in Methyl 3-Methoxypropionate (MMP) Using Triethylamine as a Catalyst A copolymer of BEBCAP and 4EPIDA was prepared using the process in Example 7 except that 6 mol % triethylamine (Sigma-Aldrich, St. Louis MO) was used in place of dibutylamine as the polymerization catalyst. The polymerization proceeded very similarly and yielded a comparably viscous, transparent yellow product solution. GPC analysis of the molecular weight characteristics of the resulting polymer yielded a Mw value of 50,010 and an Mn value of 12,938. The product showed very strong mid-ultraviolet absorbance as evidenced by the large (>0.1) extinction coefficients determined by variable angle scanning ellipsometry (VASE) for a spin-coated film of the polymer, as shown in Table 1.

TABLE 1

| Optical parameters of polymer from Example 8 | | |
|---|---|---|
| WAVELENGTH (nm) | INDEX OF REFRACTION (n) | EXTINCTION COEFFICIENT (k) |
| 308 | 1.8109 | 0.123 |
| 343 | 1.8737 | 0.078 |
| 355 | 1.8794 | 0.096 |
| 365 | 1.8810 | 0.123 |

Example 9

Polymerization of BEBCAP and 4EPIDA Copolymer in Tetrahydrofurfuryl Alcohol (THFA) Using Triethylammonium Acetate as a Catalyst

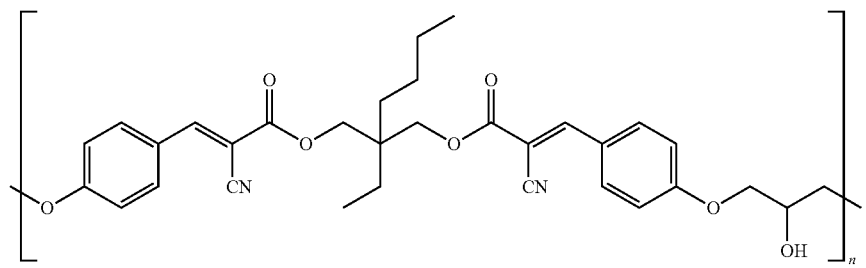

BEBCAP (biscyanoacetate monomer) and 4EPIDA (dialdehyde monomer) were copolymerized at room temperature in THFA solvent in the presence of 6 mole % triethylammonium acetate (based on the moles of dialdehyde) and at a calculated polymer solids content of 30 wt. %. In a small glass vial with screw cap were combined 2.371 grams (8.1 mmol) of BEBCAP, 2.419 grams (8.1 mmol) of 4EPIDA, 0.49 grams (0.5 mmol) of 16% triethylammonium acetate (prepared by combining equal molar amounts of triethylamine and glacial acetic acid in PGME), and 9.72 grams of THFA (Sigma-Aldrich, St. Louis MO). The contents were slowly agitated for 48 hours at room temperature by turning on a mixing wheel to produce a transparent, viscous, red-orange polymer solution. The preparation was repeated at 100-g scale and yielded a comparable result. GPC analysis of the molecular weight characteristics of the polymer product from the 100-g preparation yielded a Mw value of 49,774 and an Mn value of 11,669. The decomposition temperature ($T_d$) of the solid copolymer product as determined by ramp thermogravimetric analysis (TGA) at 10° C./min under nitrogen was 364° C. The glass transition temperature ($T_g$) of the solid copolymer product as determined by differential scanning calorimetry (DSC) was 74.3° C.

Example 10

Polymerization of BEBCAP and EVANDA in MMP/PGME Using Triethylamine as a Catalyst

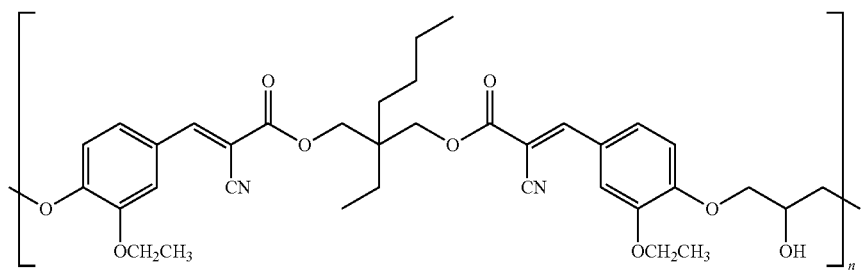

BEBCAP (biscyanoacetate monomer) and EVANDA (dialdehyde monomer) were copolymerized at room temperature in an 85/15 (w/w) mixture of MMP and PGME in the presence of 6 mol % triethylamine (based on the moles of dialdehyde) at a calculated polymer solids content of about 28 wt. %. The reaction was allowed to proceed for 48 hours, after which the catalyst was neutralized by the addition of a stoichiometric amount of trifluoroacetic acid. In a 500-ml round-bottom flask fitted with a paddle-type stirrer were combined 27.307 grams (92.8 mmol) of BEBCAP, 36.037 grams (92.8 mmol) of EVANDA, 5.63 grams (5.6 mmol) of 10% triethylamine in PGME, and 131 grams of 85/15 MMP/PGME. The contents were stirred at 200 rpm at room temperature for 72 hours to form the polymer in solution. Since the solution was hazy after reacting for 24 hours, 3.12 grams of PGME were added to help it clarify. However, the deep yellow-orange solution remained hazy until the end of the reaction period. The amine catalyst was then neutralized by adding 6.35 grams (5.6 mmol) of 10% trifluoroacetic acid in PGME and stirring the solution well to incorporate the acid. The solution clarified at this point. The final calculated polymer solids level was 28.7 wt. %. GPC analysis of the molecular weight characteristics of the polymer product yielded a Mw value of 38,814 and an Mn value of 11,315. The $T_d$ of the solid copolymer product as determined by ramp TGA at 10° C./min under nitrogen was 367° C. The $T_g$ of the solid copolymer product as determined by DSC was 82.4° C. The product showed very strong mid-ultraviolet absorbance as evidenced by the large (>0.1) extinction coefficients determined by VASE for a spin-coated film of the polymer, as shown in Table 2.

TABLE 2

| Optical parameters of polymer from Example 10 | |
|---|---|
| WAVELENGTH (nm) | EXTINCTION COEFFICIENT (k) |
| 308 | 0.179 |
| 343 | 0.300 |
| 355 | 0.372 |
| 365 | 0.415 |

Example 11

Polymerization of CAEE and 4EPIDA in Tetrahydrofuran (THF) Using Piperidine as a Catalyst

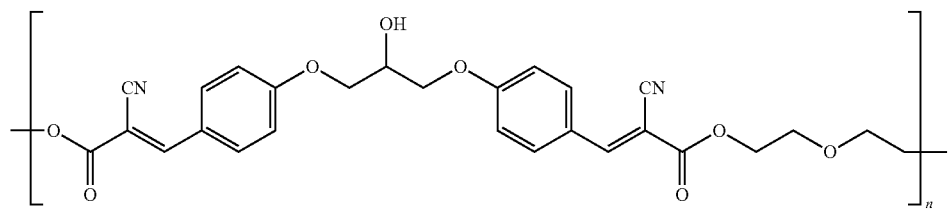

CAEE (biscyanoacetate monomer) and 4EPIDA (dialdehyde monomer) were copolymerized at about 60° C. in THF in the presence of piperidine at a calculated polymer solids content of about 30 wt. %. In a three-necked, 250-ml, round-bottom flask with a temperature-controlled oil bath, nitrogen inlet, magnetic stirrer, and a condenser were combined 4.76 grams (19.8 mmol) of CAEE and 5.95 grams (19.8 mmol) of 4EPIDA along with 23.3 grams of THF (Sigma-Aldrich, St. Louis MO). The contents were stirred under nitrogen cover until the reactants had mainly dissolved. A few drops of piperidine (Sigma-Aldrich, St. Louis MO) were then added, and the contents were heated to reflux for four hours during which time the reactants polymerized to form a moderately viscous, light-yellow solution. GPC analysis of the molecular weight characteristics of the polymer product yielded a Mw value of 21,206 and an Mn value of 4,750. The $T_d$ of the solid copolymer product as determined by ramp TGA at 10° C./min under nitrogen was 325° C. The $T_g$ of the solid copolymer product as determined by DSC was 77.5° C. The product showed very strong mid-ultraviolet absorbance as determined by VASE. Peak absorbance occurred at 374 nm. The refractive index and extinction coefficient at peak wavelength were 1.9459 and 0.239, respectively. The polymer solution formed a strong, clear yellow film when cast on glass and dried for a few minutes at 100° C. The film was difficult to remove with a razor blade, but once it was lifted by soaking in deionized water, the free-standing film did not crack or shatter and could be creased.

Example 12

Polymerization of BCAPolyTHF and 4EPIDA in MMP Using Triethylamine as a Catalyst

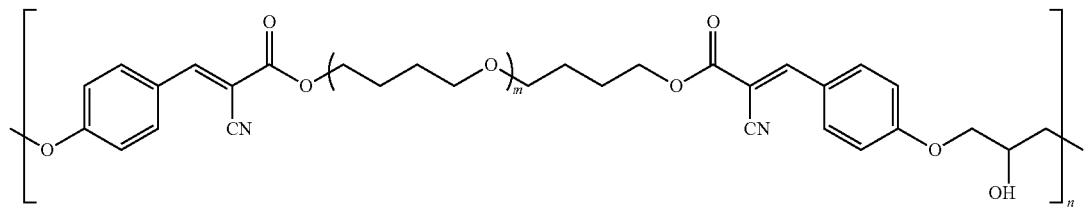

In a three-necked, 250-ml, round-bottom flask fitted with a magnetic stirrer were combined 22.44 grams (28.6 mmol) of BCAPolyTHF and 30.0 grams of MMP. While stirring, 8.59 grams (28.6 mmol) of 4EPIDA and 1.74 grams (1.7 mmol) of 10% triethylamine in PGME were added and washed in with 37.2 grams of MMP. The contents were allowed to react at room temperature for 48 hours. After reacting overnight, the reaction mixture was milky, so 20 grams of DSMO (Alfa Aesar, Ward Hill MA) were added, and it slowly clarified to a viscous, light yellow-brown solution. When the polymerization period was completed, the polymer solution was neutralized by stirring in 2.0 grams (1.8 mmol) of 10% trifluoroacetic acid in PGME. The polymer solution was coated on a glass slide and dried to form a film that was moderately tacky to the touch. The film was peeled from the slide by scraping with a razor blade. The removed material was strong and highly elastic when pulled. GPC analysis of the molecular weight characteristics of the polymer product yielded a Mw value of 128,519 and an Mn value of 25,555.

Example 13

Polymerization of MBCAP and 4EPIDA in Dimethylsulfoxide ("DMSO") Using Triethylamine as a Catalyst

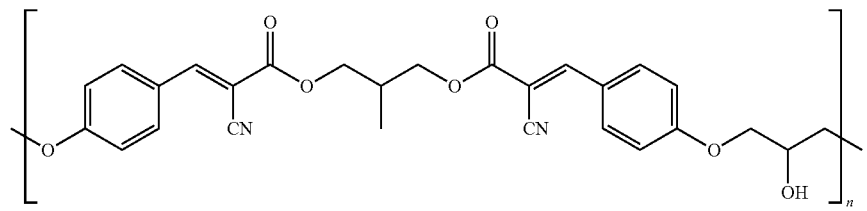

In a three-necked, 250-ml, round-bottom flask fitted with a magnetic stirrer were combined 13.770 grams (61.4 mmol) of MBCAP, 18.444 grams (61.4 mmol) of 4EPIDA, 3.729 grams (3.7 mmol) of 10% triethylamine in PGME, and 59.86 grams of DMSO. The contents were allowed to react for 24 hours at room temperature, during which they formed a very viscous polymer solution. The solution was then neutralized by stirring in 4.202 grams (3.7 mmol) of 10% trifluoroacetic acid in PGME. GPC analysis of the molecular weight characteristics of the polymer product yielded a Mw value of 52,677 and an Mn value of 13,840. The $T_d$ of the solid copolymer product as determined by ramp TGA at 10° C./min under nitrogen was 348° C. The $T_g$ of the solid copolymer product as determined by DSC was 84.1° C.

Example 14

Polymerization of BCAPolyTHF/MBCAP (1:2 Molar Ratio) and 4EPIDA in DMSO Using Triethylamine as a Catalyst

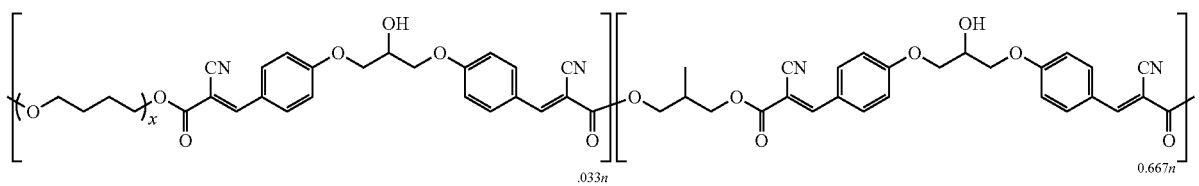

In a three-necked, 250-ml, round-bottom flask fitted with a magnetic stirrer were combined 11.61 grams (14.8 mmol) of BCAPolyTHF and 30.0 grams of DMSO. While stirring, 6.65 grams (29.7 mmol) of MBCAP, 13.35 grams (44.5 mmol) of 4EPIDA, and 2.70 grams (2.7 mmol) of 10% triethylamine in PGME were added and washed in with 32.65 grams of DMSO. The contents were allowed to react for 48 hours at room temperature to form a polymer solution. By a few hours into the reaction, the contents were hazy, so 5 grams of PGME were added, which caused the color of mixture to change from orange-brown to clear yellow. However, the haze remained until the end of the reaction period. At that time, the polymer solution was diluted to about 15% solids by adding 95 grams of DMSO and then neutralized with 3.02 grams of 10% trifluoroacetic acid in PGME. The solution fully clarified at this point and was noticeably viscous in spite of having been diluted. The solution was coated on a Pyrex® glass plate using a doctor's blade and dried for 15 minutes at 100° C. in an oven. The partially dried film was then placed in a water bath to lift the coating. It came loose easily after 30 minutes in the bath. The film was placed in a non-stick pan and baked for one hour at 100° C. to remove the last traces of DMSO. The final film was clear and almost colorless. It was tack-free at room temperature. Moreover, it was tough and strong and showed good elasticity. It could be folded and creased repeatedly without cracking or tearing.

Example 15

Curing of BEBCAP-4EPIDA Copolymer with Melamine-Formaldehyde Crosslinking Agent

Thick films (>100 μm) of BEBCAP-4EPIDA poly(cyanocinnamate) copolymer as prepared in Example 8 that could be handled and folded without cracking were obtained by curing the copolymer material with 10 phr (parts per 100 parts of resin) CYMEL® 303LF melamine-formaldehyde curing agent and 1 phr p-toluenesulfonic acid catalyst. To form these films, a 30% BEBCAP-4EPIDA solution in MMP was diluted to 8% solids with additional MMP and then combined with CYMEL 303LF curing agent and acid catalyst in the proportions given above. This mixture was cast into a non-stick pan and dried slowly on a hot plate set at 120° C. over three hours to form a thick pre-cured film. The pan was then placed in a convection oven at 130° C. for one hour to cure the film. The final film was clear yellow and showed good flexibility and resistance to bending, whereas a thick film cast from only the copolymer (no curing agent or catalyst) was brittle and cracked easily when handled.

Example 16

Thermal Curing of BEBCAP-EVANDA Copolymer

Films of the BEBCAP-EVANDA poly(cyanocinnamate) copolymer prepared in Example 10 coated onto glass slides were baked for increasing amounts of time (5-30 minutes) at 200° C. to demonstrate the curing behavior of the material. The improvement in mechanical strength and decrease in solubility in gamma-butyrolactone (GBL, a strong solvent of the polymer) with increasing baking time indicated that a curing reaction was taking place. Curing results are shown in Table 3. Similar results were obtained for BEBCAP-4EPIDA copolymer films.

TABLE 3

| | Curing characteristics | | |
|---|---|---|---|
| BAKE TEMPERATURE | BAKE TIME (MIN) | MECHANICAL QUALITIES | POST-BAKE SOLUBILITY IN GBL |
| 100° C. | 20 | very fragile and could not be folded without shattering | dissolved very rapidly |
| 200° C. | 10 | slightly stronger, but still cracked after some bending | partially dissolved and highly swollen and sticky |
| 200° C. | 15 | could be creased and folded repeatedly | swollen and sticky |
| 200° C. | 20 | could be creased and folded repeatedly | mildly swollen but not sticky |
| 200° C. | 30 | could be creased and folded repeatedly | very minor swelling and not sticky |

Example 17

UV Curing of Poly(Cyanocinnamate) Copolymers

BEBCAP-EVANDA (prepared in Example 10) and MBCAP-4EPIDA (prepared in Example 13) poly(cyanocinnamate) copolymer films coated onto glass slides were soft-baked at 100° C. for 10-15 minutes and then exposed with an ultraviolet lamp (peak intensity at 365 nm) to demonstrate the ability to cure the materials by UV exposure. The improvement in mechanical strength and decrease in solubility in DMSO (a strong solvent for the polymers) clearly indicated that a curing reaction took place during the exposure process. The films were lifted from the glass slides by soaking in deionized water to perform the tests. After a 100° C. bake only, the BEBCAP-EVANDA film was very fragile and could not be folded without shattering or cracking, but after a 5-minute UV exposure, the film was much stronger and could be folded and creased. After a 100° C. bake only, over 90% of the MBCAP-4EPIDA film dissolved in DMSO within two minutes, but after an 8-minute UV exposure, the film did not dissolve or swell significantly after a 15-minute solvent exposure.

Example 18

Embossing and Photo-Curing of Poly(Cyanocinnamate) Copolymer Films

Figure 5:
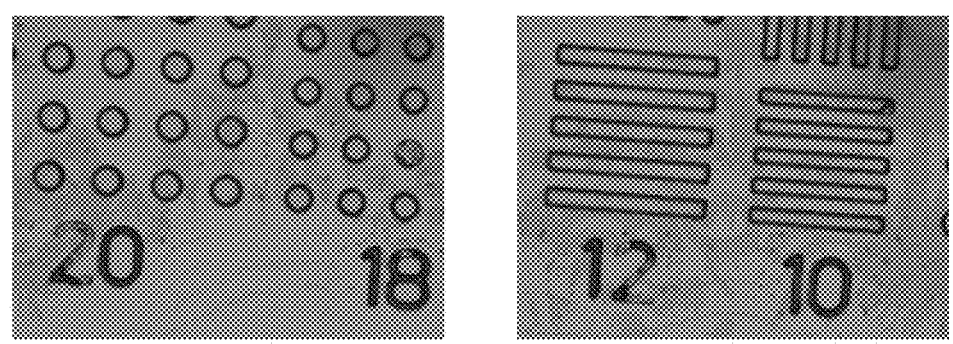
FIG. 5 shows microscopic images of circle and line features embossed as described in Example 18.

To demonstrate that the poly(cyanocinnamate) materials described herein can be thermo-forming below 200° C., an uncured, 5.8-μm thick film of BEBCAP-EVANDA copolymer prepared in Example 10 was diluted with MMP and formed by spin coating on a 200-mm wafer and then embossed by pressing it against a polysiloxane stamp formed on a second silicon wafer. The pressing step was conducted in a standard wafer bonding tool (EVGroup Model 510) with the wafer heated to 170° C. under a force of 4,000 N for five minutes at a pressure of 18.5 psi. The assembly was then cooled to room temperature, and the stamp was mechanically peeled away from the embossed film. Microscopic images of the embossed features in the poly(cyanocinnamate) film are shown in FIG. 5, where the numbers in the microphotographs refer to the feature sizes in microns.

Figure 6:
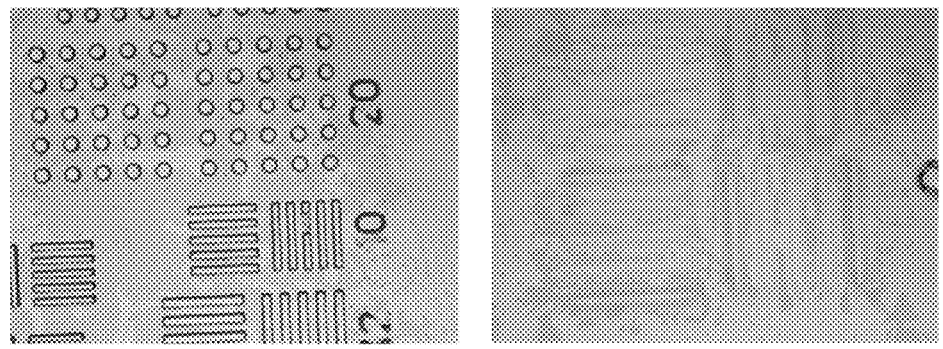
FIG. 6 provides microphotographs of embossed features after photo-curing and then heating to 180° C. (left) and same embossed features but not photo-cured before heating (right) as described in Example 18.

Subsequently, the embossed wafer substrate was masked in half, and one side was exposed to a laboratory UV lamp with a 365 nm peak output for five minutes while the other side was left unexposed. When the wafer was heated to 180° C. for five minutes, the features on the photo-cured side were well preserved, while the features on the uncured side flowed and became non-distinct as shown in FIG. 6. The results demonstrated that by photo-curing the poly(cyanocinnamate) film, it became resistant to thermal reflow at temperatures nearly 100° C. above the glass transition temperature of the parent copolymer material.

Example 19

Laser Etching of Poly(Cyanocinnamate) Films

Figure 7:
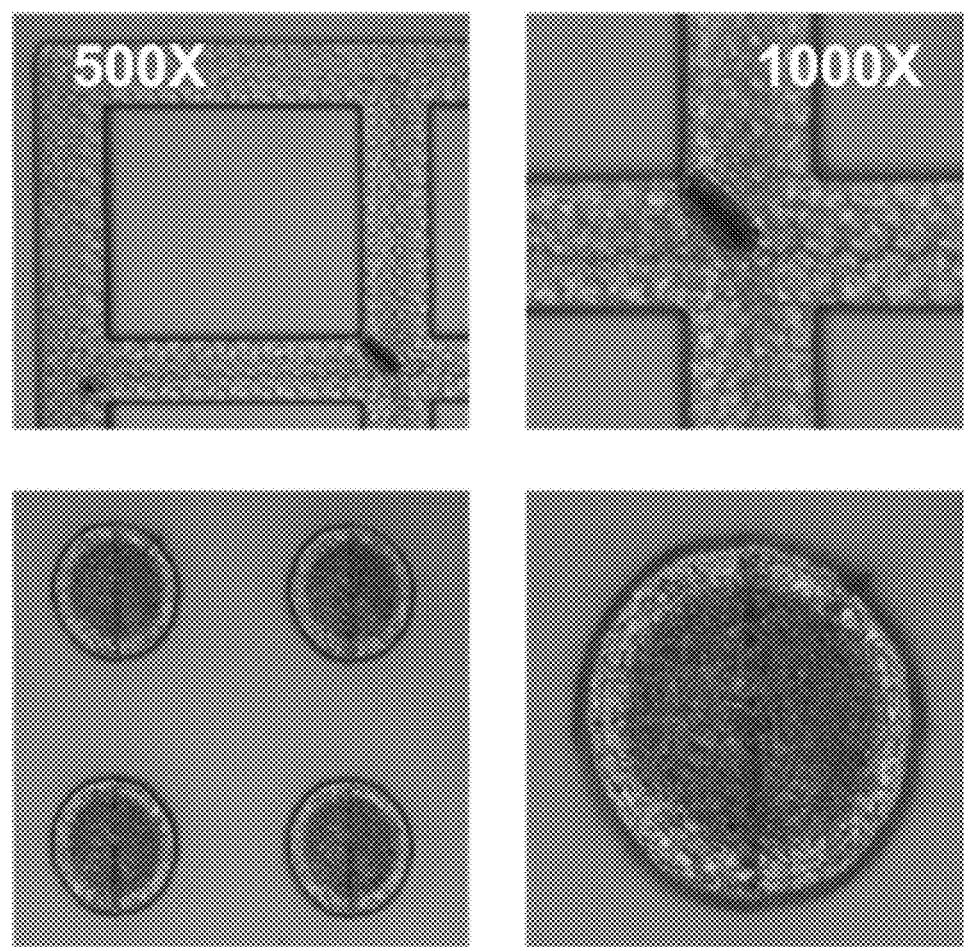
FIG. 7 shows microscopic images of pad and via features patterned in a film of BEBCAP-EVANDA poly(cyanocinnamate) by a picosecond laser etching system (see Example 19).

The strong optical absorbance of poly(cyanocinnamate) materials in the mid-UV portion of the spectrum makes them very sensitive to ablative pulsed laser etching systems that operate at 308-355 nm wavelengths. Silicon wafers coated with a 10-15 μm thick layer of BEBCAP-EVANDA copolymer prepared in Example 10 diluted with MMP were patterned with pad (200×200 μm) and via (100 μm diameter) features by Laser Light Technologies (Herman, MO) using a picosecond pulsed laser system operating at 355 nm. The relevant laser operating parameters were as follows:
Laser pulse energy: 0.33 μJ/pulse
Average laser power: 0.825 mW
Peak laser power: 22 kW
Pulse length: <15 ps
Laser repetition rate: 2500 Hz Microscopic images of the pad and via features after the specimens were cleaned by sonication for a few minutes in deionized water are shown in FIG. 7. (In the images, the exposed silicon, which was slightly etched by the laser, has a roughened, metallic appearance while the polymer features are smooth and uniform in appearance.) The etching process produced little carbonaceous residue, and the feature edges were sharp and crisp, demonstrating that the poly(cyanocinnamate) material could be etched efficiently and cleanly at very low average laser power.

Example 20

Preparation of Poly(Cyanocinnamate) Dry Film and Lamination of the Film to a Silicon Wafer Substrate A 30% solution of BEBCAP-4EPIDA poly(cyanocinnamate) in MMP like that prepared in Example 8 was cast onto a film carrier using a slot die coater. The bar gap of the slot die coater was set to 50 μm, and the coating speed was set to 4 m/min. The carrier film was a release-treated PET film (50-um thick Nanya I-1950A). After coating, the wet film on carrier was baked for 2 minutes at 25° C., 5 minutes at 60° C., and then 10 minutes at 130° C. to remove most of the solvent. Minor edge de-wetting was observed while baking. The coated poly(cyanocinnamate) film was then easily separated from the carrier film and formed a 20-um thick, free-standing dry film. The dry film had excellent optical clarity, and text could be easily read through the transparent film.

The dry film was detached from the PET carrier and then laminated to a silicon wafer at 130° C. using a commercial film lamination tool. The operating speed of the laminator was 0.25 m/min. It was also possible to remove the carrier film after lamination, leaving only the poly(cyanocinnamate) film on the wafer. The quality of the laminated film was excellent; there were no bubbles, wrinkles, or other defects.

We claim:

1. A method of patterning a laserable layer supported on a substrate, or on at least one optionally present intervening layer between said laserable layer and said substrate, wherein the laserable layer is formed from a composition comprising from about 5% by weight to about 40% by weight of a poly(cyanocinnamate), based on the weight of the composition taken as 100% by weight, and the method comprises one or both of:
    (1) exposing the laserable layer to laser energy so as to remove at least a portion of the laserable layer; or
    (2) contacting a mold having a pattern formed therein with said laserable layer so as to transfer said pattern to said laserable layer.

2. The method of claim 1, wherein said poly(cyanocinnamate) comprises a copolymer of a bis(cyanoacetate) and a hydroxypropyl-linked aromatic dialdehyde.

3. The method of claim 1, wherein said poly(cyanocinnamate) comprises

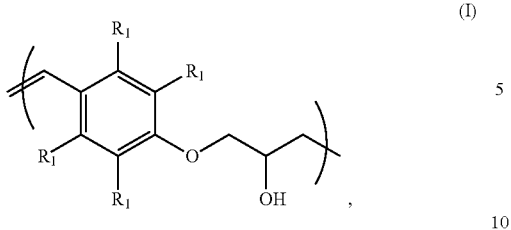

(I)

wherein each $R_1$ is individually chosen from hydrogen, alkyls, aryls, aryl ethers, alkylaryls, alkoxys, and halogens.

4. The method of claim 1, wherein said poly(cyanocinnamate) comprises

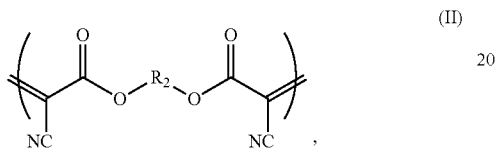

(II)

where $R_2$ is a divalent group.

5. The method of claim 1, wherein said poly(cyanocinnamate) comprises

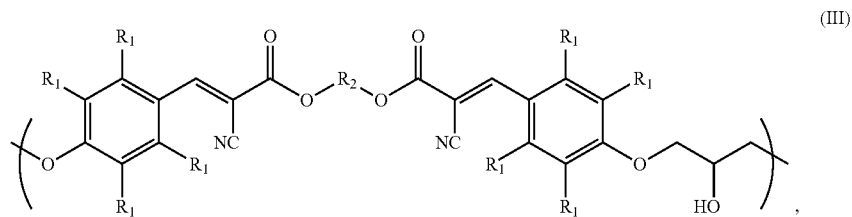

(III)

wherein:
each $R_1$ is individually chosen from hydrogen, alkyls, aryls, aryl ethers, alkylaryls, alkoxys, and halogens; and
$R_2$ is a divalent group.

6. The method of claim 1, wherein said poly(cyanocinnamate) comprises recurring cyanocinnamate groups.

7. The method of claim 1, wherein said poly(cyanocinnamate) comprises crosslinked cyanocinnamate groups.

8. The method of claim 1, wherein said poly(cyanocinnamate) comprises one or more of the following:

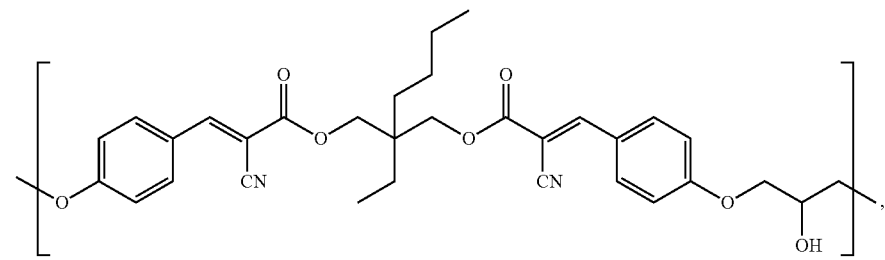

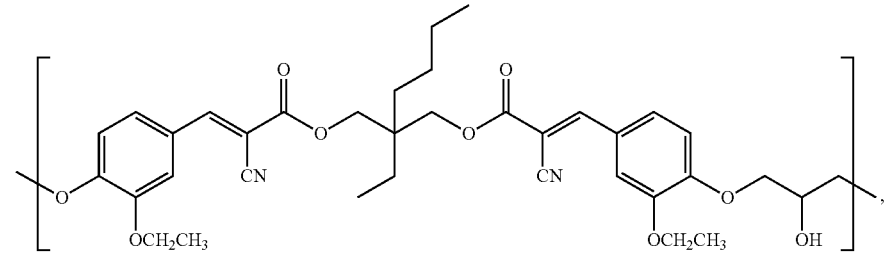

-continued

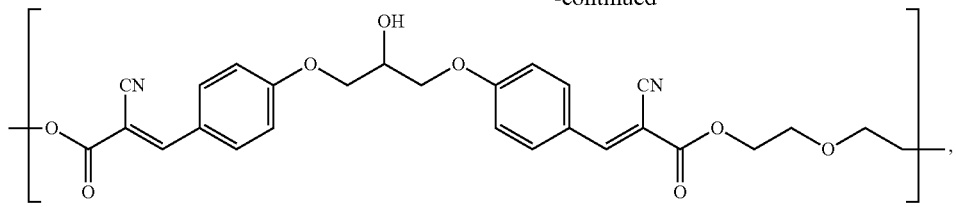

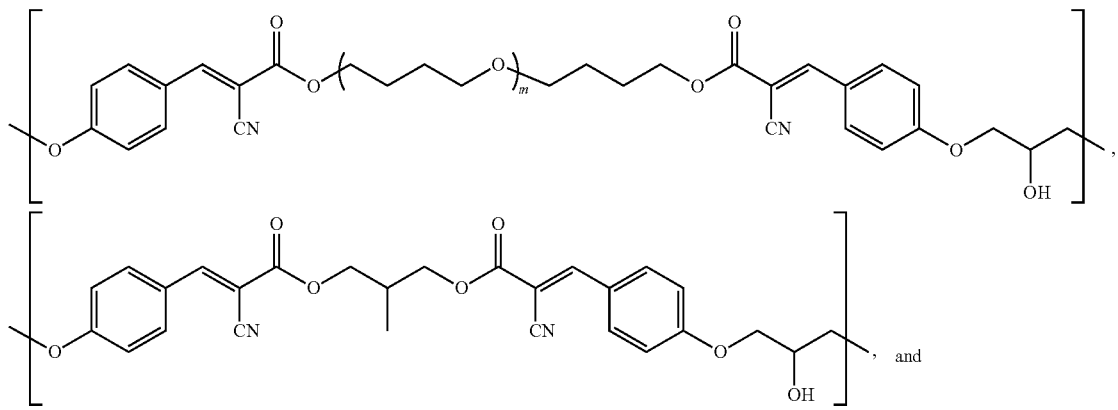

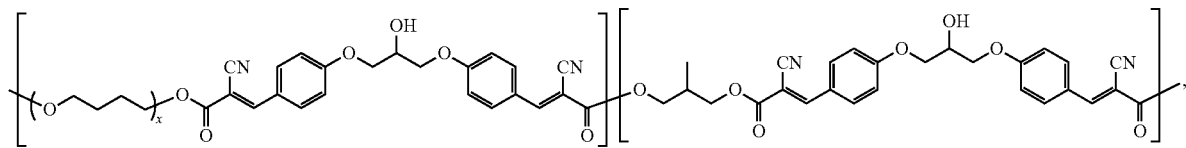

where:
x is 1 to about 50; and
m is 1 to about 50.

9. The method of claim 1, wherein said laserable layer is formed by applying a composition comprising said poly(cyanocinnamate) to said substrate, or to said optionally present intervening layer, and heating said composition at a temperature of from about 100° C. to about 200° C. for a time period of from about 5 minutes to about 30 minutes.

10. The method of claim 1, wherein (1) comprises exposing said laserable layer to laser energy at a wavelength of from about 200 nm to about 450 nm and at a pulse rate of from about 100 Hz to about 3,500 Hz.

11. The method of claim 1, wherein said removing in (1) yields a pattern in said laserable layer.

12. The method of claim 1, where (2) comprises contacting said mold with said laserable layer at a pressure of from about 1 psi to about 100 psi and a temperature of from about 100° C. to about 200° C. for a time period of from about 1 minute to about 10 minutes.

13. The method of claim 1, wherein during (2) said laserable layer is soft or flowable, and said contacting is maintained while said laserable layer hardens or cures.

14. The method of claim 1, wherein said laserable layer has a thickness and wherein said removing creates an opening in said laserable layer that does not extend across its entire thickness.

15. A structure comprising:
a microelectronic substrate selected from the group consisting of silicon, SiGe, SiO$_2$, Si$_3$N$_4$, SiON, aluminum, tungsten, tungsten silicide, gallium arsenide, germanium, tantalum, tantalum nitride, Ti$_3$N$_4$, hafnium, HfO$_2$, ruthenium, indium phosphide, coral, black diamond, and glass substrates; and
a laserable layer on said substrate, or on at least one optionally present intervening layer between said laserable layer and said substrate, said laserable layer:
being formed from a composition comprising from about 5% by weight to about 40% by weight of a poly(cyanocinnamate), based on the weight of the composition taken as 100% by weight;
having an upper surface and a lower surface, with the upper surface being remote from the microelectronic substrate and the lower surface being adjacent the microelectronic substrate; and
comprising at least one opening formed therein, said at least one opening having an upper edge at said upper surface, there being laser ablation residue from said poly(cyanocinnamate) at, near, or both at and near said upper edge of said at least one opening.

16. The structure of claim 15, wherein said layer is a dielectric layer.

17. The structure of claim 15, wherein said at least one opening is selected from the group consisting of lines, spaces, and vias.

18. The structure of claim 15, wherein said poly(cyanocinnamate) comprises a copolymer of a bis(cyanoacetate) and a hydroxypropyl-linked aromatic dialdehyde.

19. The structure of claim 15, wherein said poly(cyanocinnamate) comprises

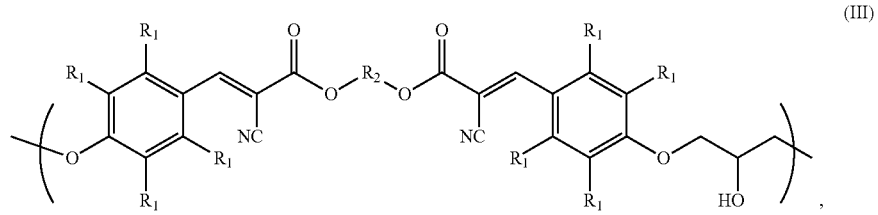
wherein:
  each $R_1$ is individually chosen from hydrogen, alkyls, aryls, aryl ethers, alkylaryls, alkoxys, and halogens; and
  $R_2$ is a divalent group.
20. The structure of claim 15, wherein said poly(cyanocinnamate) comprises crosslinked cyanocinnamate groups.
21. The structure of claim 15, wherein said poly(cyanocinnamate) comprises one or more of the following:
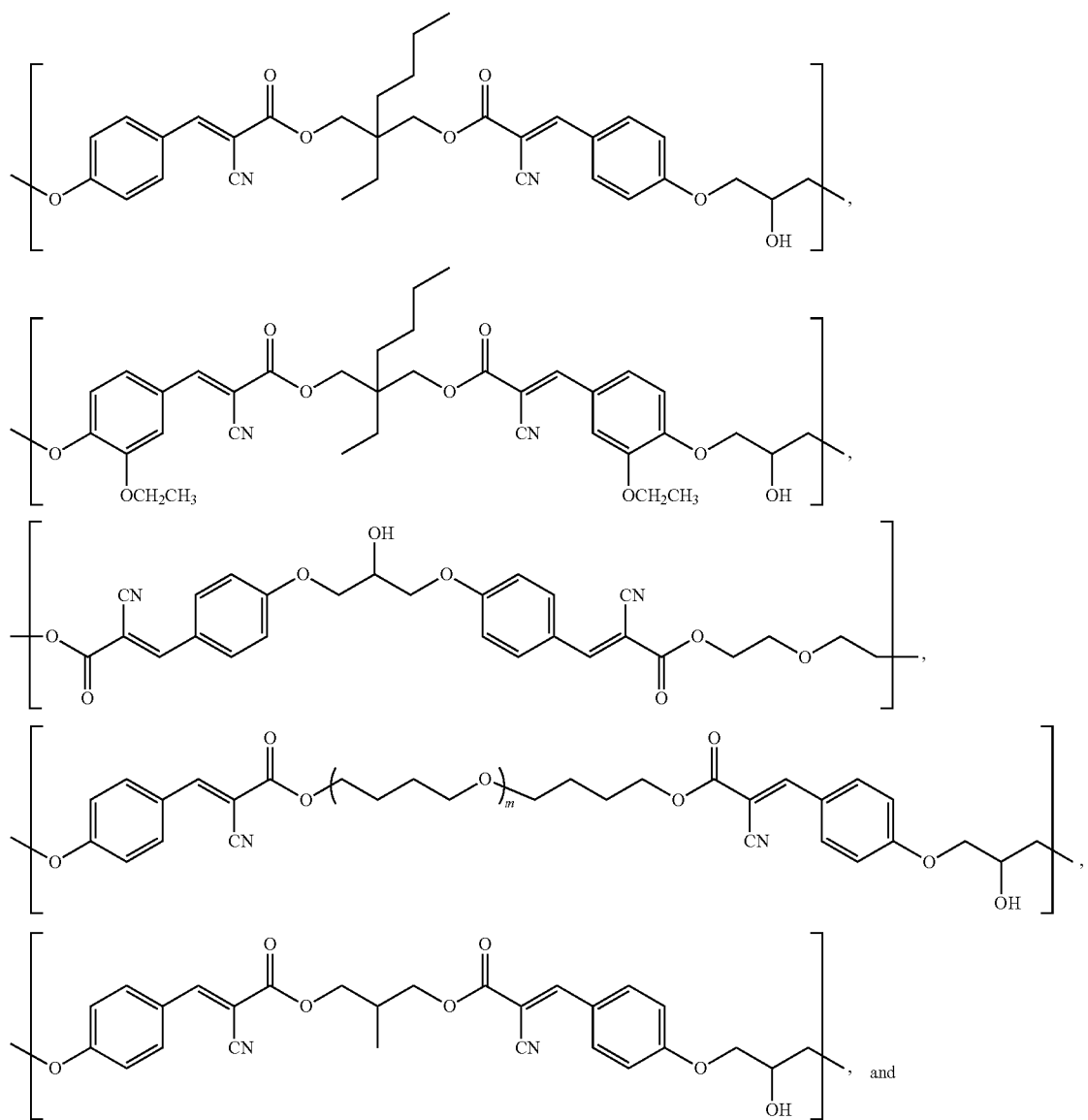

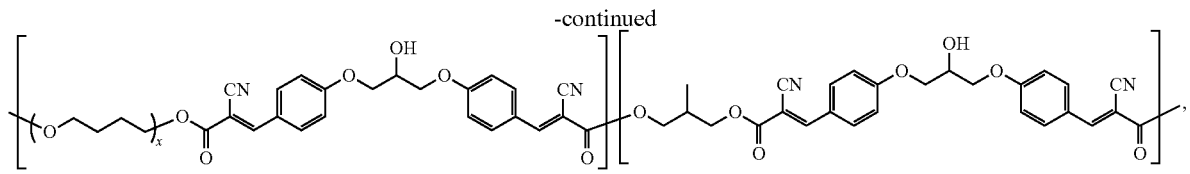
where:
  x is 1 to about 50; and
  m is 1 to about 50.
22. A polymer comprising
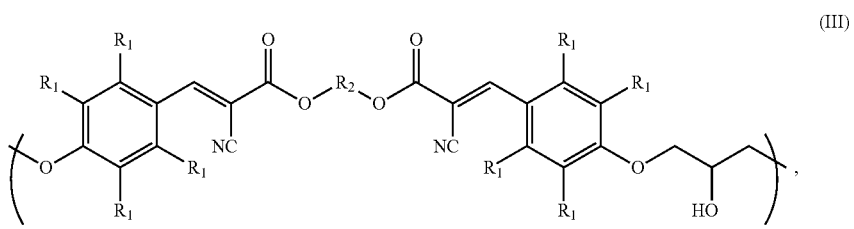
(III)
wherein:
  each $R_1$ is individually chosen from hydrogen, alkyls, aryls, aryl ethers, alkylaryls, alkoxys, and halogens; and
  $R_2$ is a divalent group.
23. The polymer of claim 22, where (III) is chosen from one or more of the following:
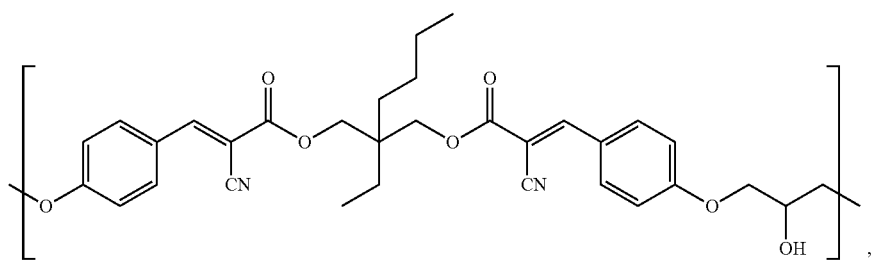
,
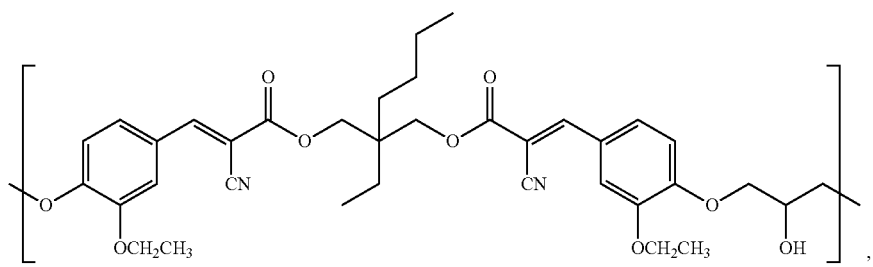
,
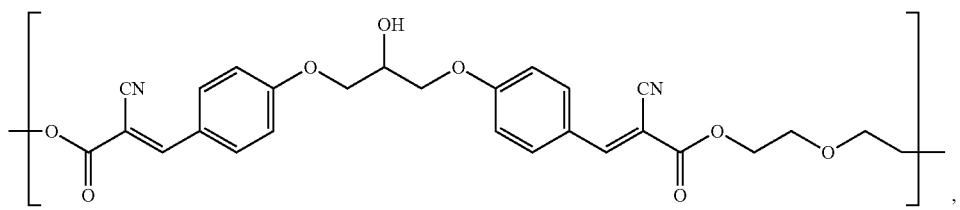
, -continued

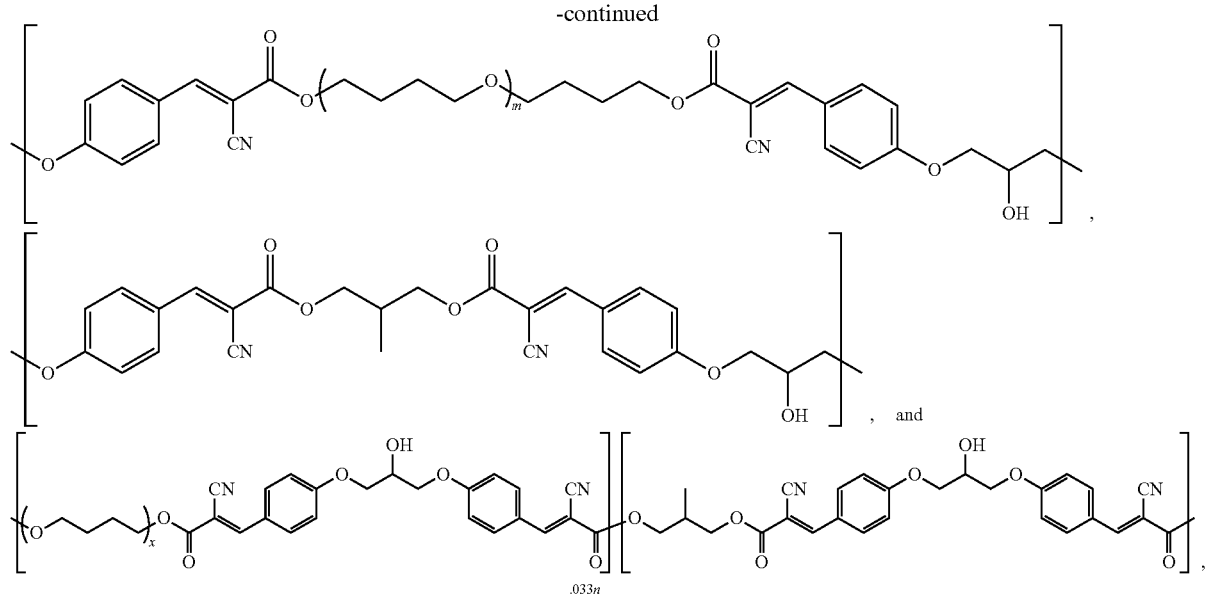

where:
x is 1 to about 50; and
m is 1 to about 50.

24. A composition comprising the polymer of claim 22 dissolved or dispersed in a solvent system.

25. The method of claim 1, wherein said composition comprises a solvent selected from the group consisting of dimethylsulfoxide, tetrahydrofuran, methyl 3-methoxypropionate, tetrahydrofurfuryl alcohol, cyclopentanone, cyclohexanone, methyl ethyl ketone, 1,4-dioxane, diglyme, and mixtures thereof.

26. The structure of claim 15, wherein said composition comprises a solvent selected from the group consisting of dimethylsulfoxide, tetrahydrofuran, methyl 3-methoxypropionate, tetrahydrofurfuryl alcohol, cyclopentanone, cyclohexanone, methyl ethyl ketone, 1,4-dioxane, diglyme, and mixtures thereof.

27. The method of claim 1, wherein said poly(cyanocinnamate) has a weight average molecular weight of about 38,000 Daltons to about 129,000 Daltons.

28. The structure of claim 15, wherein said poly(cyanocinnamate) has a weight average molecular weight of about 38,000 Daltons to about 129,000 Daltons.

* * * * *